United States Patent
Utsuno et al.

(10) Patent No.: US 8,647,537 B2
(45) Date of Patent: Feb. 11, 2014

(54) OXIDE SINTERED BODY AND SPUTTERING TARGET

(75) Inventors: Futoshi Utsuno, Chiba (JP); Kazuyoshi Inoue, Chiba (JP); Hirokazu Kawashima, Chiba (JP); Masashi Kasami, Chiba (JP); Koki Yano, Chiba (JP); Kota Terai, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 279 days.

(21) Appl. No.: 13/119,838

(22) PCT Filed: Sep. 14, 2009

(86) PCT No.: PCT/JP2009/004569
§ 371 (c)(1),
(2), (4) Date: Apr. 7, 2011

(87) PCT Pub. No.: WO2010/032422
PCT Pub. Date: Mar. 25, 2010

(65) Prior Publication Data
US 2011/0180763 A1 Jul. 28, 2011

(30) Foreign Application Priority Data
Sep. 19, 2008 (JP) .................. 2008-241644
Feb. 25, 2009 (JP) .................. 2009-043153

(51) Int. Cl.
*H01B 1/02* (2006.01)
(52) U.S. Cl.
USPC .............. 252/518.1; 252/520.1; 252/521.1; 257/43; 257/47

(58) Field of Classification Search
USPC .............. 252/521.1, 518.1, 520.1; 257/43, 75
See application file for complete search history.

(56) References Cited

U.S. PATENT DOCUMENTS

| | | | |
|---|---|---|---|
| 5,407,602 A | 4/1995 | Cava | |
| 7,476,343 B2 | 1/2009 | Nakayama et al. | |
| 7,611,646 B2 | 11/2009 | Nakayama et al. | |
| 7,641,818 B2 | 1/2010 | Nakayama et al. | |
| 8,333,913 B2 * | 12/2012 | Inoue et al. | 252/521.1 |
| 2004/0180217 A1 | 9/2004 | Inoue et al. | |
| 2006/0043377 A1 | 3/2006 | Hoffman et al. | |
| 2007/0170434 A1 * | 7/2007 | Inoue et al. | 257/72 |

(Continued)

FOREIGN PATENT DOCUMENTS

| | | |
|---|---|---|
| JP | 7 182924 | 7/1995 |
| JP | 9 50711 | 2/1997 |

(Continued)

OTHER PUBLICATIONS

National Institute of Advanced Industrial & Technology, "Semiconductor device containing group III oxide semiconductor," Patent Abstracts of Japan, Publication Date: Nov. 22, 2007; English Abstract of JP-2007 305975.

(Continued)

*Primary Examiner* — Khanh Tuan Nguyen
(74) *Attorney, Agent, or Firm* — Miller, White, Zelano & Branigan, P.C.

(57) ABSTRACT

An oxide sintered body includes indium oxide and gallium solid-solved therein, the oxide sintered body having an atomic ratio "Ga/(Ga+In)" of 0.001 to 0.12, containing indium and gallium in an amount of 80 atom % or more based on total metal atoms, and having an $In_2O_3$ bixbyite structure.

11 Claims, 19 Drawing Sheets

EXAMPLE 1

(56) References Cited

U.S. PATENT DOCUMENTS

| | | |
|---|---|---|
| 2007/0200100 A1 | 8/2007 | Nakayama et al. |
| 2008/0032106 A1 | 2/2008 | Nakayama et al. |
| 2008/0308774 A1 | 12/2008 | Inoue et al. |
| 2009/0123724 A1 | 5/2009 | Nakayama et al. |
| 2010/0009157 A1 | 1/2010 | Nakayama et al. |
| 2010/0038605 A1 | 2/2010 | Nakayama et al. |
| 2010/0078192 A1 | 4/2010 | Nakayama et al. |
| 2010/0129660 A1 | 5/2010 | Nakayama et al. |
| 2012/0068130 A1 | 3/2012 | Inoue et al. |

FOREIGN PATENT DOCUMENTS

| | | | |
|---|---|---|---|
| JP | 09 259640 | 10/1997 | |
| JP | 2004 119525 | 4/2004 | |
| JP | 2005 314734 | 11/2005 | |
| JP | 2005 347215 | 12/2005 | |
| JP | 2007 113026 | 5/2007 | |
| JP | 2007 210823 | 8/2007 | |
| JP | 2007 224386 | 9/2007 | |
| JP | 2007 277039 | 10/2007 | |
| JP | 2007 305975 | 11/2007 | |
| WO | WO-03 014409 | 2/2003 | |
| WO | WO-2006 070715 | 7/2006 | |
| WO | WO-2009 008297 | 1/2009 | |
| WO | WO 2009-008297 | * 1/2009 | .............. C04B 35/00 |

OTHER PUBLICATIONS

Office Action in Japanese Patent Application No. 2012-144097 dated Aug. 21, 2012.

Office Action in Japanese Patent Application No. 2012-144098 dated Aug. 28, 2012.

Translation of Part of Japanese Office Action relating to JP-2007 305975.

Office Action in Japanese Patent Application No. 2012-144097 dated Nov. 28, 2012.

Wang, A., et al., "Growth, microstructure, charge transport, and transparency of random polycrystalline and heteroepitaxial metalorganic chemical vapor deposition-derived gallium-indium-oxide thin films," J. Mater. Res., vol. 17, No. 12, Dec. 2002, pp. 3155-3162.

Idemitsu Kosan Co Ltd., "Sputtering target, transparent conductive film and transparent conductive glass substrate," Patent Abstracts of Japan, Publication Date: Nov. 10, 2005; English Abstract of JP-2005 314734.

Idemitsu Kosan Co., "Conductive film, conductive base material and organic electroluminescence element," Retrieved from the Espacenet database, Publication Date: Jul. 6, 2006; English Abstract of WO-2006 070715.

International Preliminary Report on Patentability for PCT/JP2009/004569 dated Apr. 28, 2011.

International Search Report for PCT/JP2009/004569 dated Dec. 17, 2009.

Japan Science & Technology Corp., "Oxide Semiconductor Pn Junction Device," Patent Abstract of Japan, Publication Date: Apr. 15, 2004; English Abstract of JP-2004 119525.

Japan Society for the Promotion of Science Tomei Sankabutsu Hikara Denshi Zairyo Dai 166 linksi, Tomei Dodenmarku no Gijutsu, $1^{st}$ Edition, $2^{nd}$ Print, Ohmsha, Ltd., Apr. 25, 2000, pp. 82, 84, 85.

Kobe Steel Ltd., "Transparent conductive film," Patent Abstracts of Japan, Publication Date: Feb. 18, 1997; English Abstract of JP-09-050711.

Minami Uchitsugu Takada Shinzo., "Transparent Conductive film," Patent Abstracts of Japan, Publication Date: Oct. 3, 1997; English Abstract of JP-09 259640.

Minami, T. et al., "Preparation of highly transparent and conducting $Ga_2O_3$—$In_2O_3$ films by direct current magnetron sputtering," J. Vas. Sci. Technol., 1997, vol. 15, No. 3, pp. 958-962.

Sumitomo Metal Mining Co Ltd., "Oxide sintered compact and method for producing oxide transparent electroconductive film using the same," Patent Abstracts of Japan, Publication Date: Oct. 25, 2007; English Abstract of JP-2007 277039.

Sumitomo Metal Mining Co Ltd., "Transparent electronically conductive film and transparent electrically conductive base material comprising the same," Patent Abstracts of Japan, Publication Date: May 10, 2007; English Abstract of JP-2007 113026.

* cited by examiner

FIG. 11 EXAMPLE 11

OXIDE SINTERED BODY AND SPUTTERING TARGET

TECHNICAL FIELD

The invention relates to an oxide sintered body that includes indium oxide and gallium solid-solved therein, a sputtering target that includes the oxide sintered body, a thin film produced using the sputtering target, and a thin film transistor that includes the thin film.

BACKGROUND ART

In recent years, development of display devices has rapidly progressed, and various display devices such as a liquid crystal display device and an EL display device have been extensively used for office automation equipment such as a personal computer and a word processor. These display devices have a sandwich structure in which a display element is disposed between transparent conductive films.

A silicon-based semiconductor film is mainly used for a switching element that drives a display device. This is because a silicon-based thin film exhibits excellent stability, excellent workability, a high switching speed, and the like. A silicon-based thin film is generally formed by chemical vapor deposition (CVD).

An amorphous silicon-based thin film has a problem in that a video or the like cannot be displayed at a high frame rate due to a relatively low switching speed. A crystalline silicon-based thin film achieves a relatively high switching speed, but requires a high temperature of 800° C. or more, laser heating, or the like for crystallization. Specifically, a large amount of energy and a large number of steps are required for producing a crystalline silicon-based thin film. A silicon-based thin film exhibits excellent performance as a voltage element, but shows a change in characteristics with time when causing a current to flow therethrough.

Therefore, use of a film other than a silicon-based thin film has been studied.

A transparent semiconductor thin film formed of indium oxide, gallium oxide, and zinc oxide, and a transparent semiconductor thin film formed of zinc oxide and magnesium oxide have been proposed as a transparent semiconductor film that exhibits excellent stability as compared with a silicon-based thin film, and has a light transmittance equal to that of an ITO film, and as a target used to produce such a transparent semiconductor film (e.g., Patent Document 1).

Patent Document 2 discloses a composition that includes indium oxide and gallium oxide as the main components, and contains an $InGaO_3$ compound. Patent Document 2 relates to a transparent conductive film.

Patent Document 3 discloses an $In_2O_3$ transparent conductive film that contains 1 to 10 atom % of gallium (Ga). The transparent conductive film disclosed in Patent Document 3 is produced by cosputtering in a state in which gallium metal is disposed on an $In_2O_3$ target.

Patent Document 4 discloses a sintered body composition for a transparent conductive film that has a Ga/(In+Ga) ratio of 0.35 or more and less than 1.0, and includes a $(Ga,In)_2O_3$ phase. Patent Document 5 discloses an oxide sintered body for a transparent conductive film that has a Ga/(In+Ga) ratio of 0.65 or more and less than 1.0, and includes a $(Ga,In)_2O_3$ phase.

Patent Document 6 discloses an indium oxide-gallium oxide sintered body that contains 49.1 to 65 atom % of gallium. Patent Document 7 discloses a sputtering target using a sintered body having a Ga/In ratio of 0.97 to 1.86. Patent Document 8 discloses an indium oxide-gallium oxide sintered body that contains 35 to 45 atom % of gallium, and Patent Document 9 discloses an indium oxide-gallium oxide sintered body that contains 15 to 49 atom % of gallium.

However, a crystalline oxide semiconductor film formed of indium oxide and gallium oxide cannot be obtained when the gallium content is within the ranges disclosed in Patent Documents 6 to 9. Moreover, when using the compositions disclosed in Patent Documents 6 to 9, an $InGaO_3$ crystal phase that exhibits high insulating properties may be produced, so that an abnormal discharge or nodules may occur during sputtering.

An object of the invention is to provide a non-silicon-based semiconductor thin film that may be used for a thin film transistor, and a sputtering target used to produce the non-silicon-based semiconductor thin film. Another object of the invention is to provide a thin film transistor that includes a novel non-silicon-based semiconductor thin film.

RELATED-ART DOCUMENT

Patent Document

Patent Document 1: JP-A-2004-119525
Patent Document 2: JP-A-7-182924
Patent Document 3: JP-A-9-50711
Patent Document 4: JP-A-2007-277039
Patent Document 5: JP-A-2007-210823
Patent Document 6: JP-A-2007-224386
Patent Document 7: JP-A-2007-113026
Patent Document 8: JP-A-2005-347215
Patent document 9: JP-A-9-259640

SUMMARY OF THE INVENTION

The invention provides the following oxide sintered body, sputtering target, oxide thin film, thin film transistor, and methods of producing the same.
1. An oxide sintered body including indium oxide and gallium solid-solved therein, the oxide sintered body having an atomic ratio "Ga/(Ga+In)" of 0.001 to 0.12, containing indium and gallium in an amount of 80 atom % or more based on total metal atoms, and having an $In_2O_3$ bixbyite structure.
2. The oxide sintered body according to 1, the oxide sintered body having an atomic ratio "Ga/(Ga+In)" of 0.001 to 0.10.
3. The oxide sintered body according to 1, the oxide sintered body having an atomic ratio "Ga/(Ga+In)" of 0.005 to 0.08.
4. The oxide sintered body according to any one of 1 to 3, wherein the bixbyite structure has a lattice constant of 10.05 Å or more and less than 10.118 Å.
5. The oxide sintered body according to any one of 1 to 4, the oxide sintered body having a density of 6.5 to 7.1 g/cm$^3$.
6. The oxide sintered body according to any one of 1 to 5, the oxide sintered body having a bulk resistivity of 10 mΩcm or less.
7. The oxide sintered body according to any one of 1 to 6, wherein dispersed gallium aggregates have a diameter of less than 1 μm.
8. The oxide sintered body according to any one of 1 to 7, the oxide sintered body having a content of metal ions having a positive valence of 4 or more of 100 atomic ppm or less.
9. The oxide sintered body according to any one of 1 to 8, the oxide sintered body having a content of metal ions having a positive valence of 2 or less of 100 atomic ppm or less, the content of metal ions having a positive valence of 4 being equal to or lower than the content of metal ions having a positive valence of 2.

10. The oxide sintered body according to any one of 1 to 9, further including one or two or more oxides selected from yttrium oxide, scandium oxide, aluminum oxide, and boron oxide.

11. The oxide sintered body according to 10, the oxide sintered body having a content of the one or two or more oxides selected from yttrium oxide, scandium oxide, aluminum oxide, and boron oxide, of 0.01 to 5 atom %.

12. A method of producing the oxide sintered body according to any one of 1 to 11, the method including mixing an indium compound powder having an average particle size of less than 2 µm with a gallium compound powder having an average particle size of less than 2 µm in an atomic ratio "Ga/(In+Ga)" of 0.001 to 0.12, shaping the resulting mixture, and firing the resulting shaped product at 1200 to 1600° C. for 2 to 96 hours.

13. The method according to 12, wherein the shaped product is fired in an oxygen atmosphere or under pressure.

14. A sputtering target including the oxide sintered body according to any one of 1 to 11.

15. An oxide thin film formed using the sputtering target according to 14.

16. An oxide thin film including indium oxide and gallium solid-solved therein, the oxide thin film having an atomic ratio "Ga/(Ga+In)" of 0.001 to 0.12, containing indium and gallium in an amount of 80 atom % or more based on total metal atoms, and having an $In_2O_3$ bixbyite structure.

17. The oxide thin film according to 16, the oxide thin film having an atomic ratio "Ga/(Ga+In)" of 0.001 to 0.10.

18. The oxide thin film according to 16, the oxide thin film having an atomic ratio "Ga/(Ga+In)" of 0.005 to 0.08.

19. The oxide thin film according to any one of 16 to 18, wherein the bixbyite structure has a lattice constant of 10.01 Å or more and less than 10.118 Å.

20. The oxide thin film according to any one of 16 to 19, wherein dispersed gallium aggregates have a diameter of less than 1 µm.

21. The oxide thin film according to any one of 16 to 20, further including one or two or more oxides selected from yttrium oxide, scandium oxide, aluminum oxide, and boron oxide.

22. The oxide thin film according to 21, the oxide thin film having a content of the one or two or more oxides selected from yttrium oxide, scandium oxide, aluminum oxide, and boron oxide, of 0.01 to 5 atom %.

23. A thin film transistor including the oxide thin film according to any one of 15 to 22.

24. The thin film transistor according to 23, the thin film transistor being a channel-etch thin film transistor.

25. The thin film transistor according to 23, the thin film transistor being an etch-stopper thin film transistor.

26. A method of producing a thin film transistor including forming an oxide thin film using the sputtering target according to 14, and crystallizing the oxide thin film by heating the oxide thin film in an oxygen atmosphere.

27. The method according to 26, wherein the oxide thin film is formed in a film forming gas having an oxygen content of 10 vol % or more.

28. The method according to 26 or 27, wherein the oxide thin film is crystallized by heating the oxide thin film at 250 to 500° C. for 0.5 to 1200 minutes.

29. The method according to any one of 26 to 28, further including forming an oxide insulator layer on the oxide thin film that has been heated.

30. A semiconductor device including the thin film transistor according to any one of 23 to 25.

The invention thus provides a non-silicon-based semiconductor thin film that may be used for a thin film transistor, and a sputtering target used to produce the non-silicon-based semiconductor thin film. The invention also thus provides a thin film transistor that includes a novel non-silicon-based semiconductor thin film.

MODE FOR CARRYING OUT THE INVENTION

Figure 1:
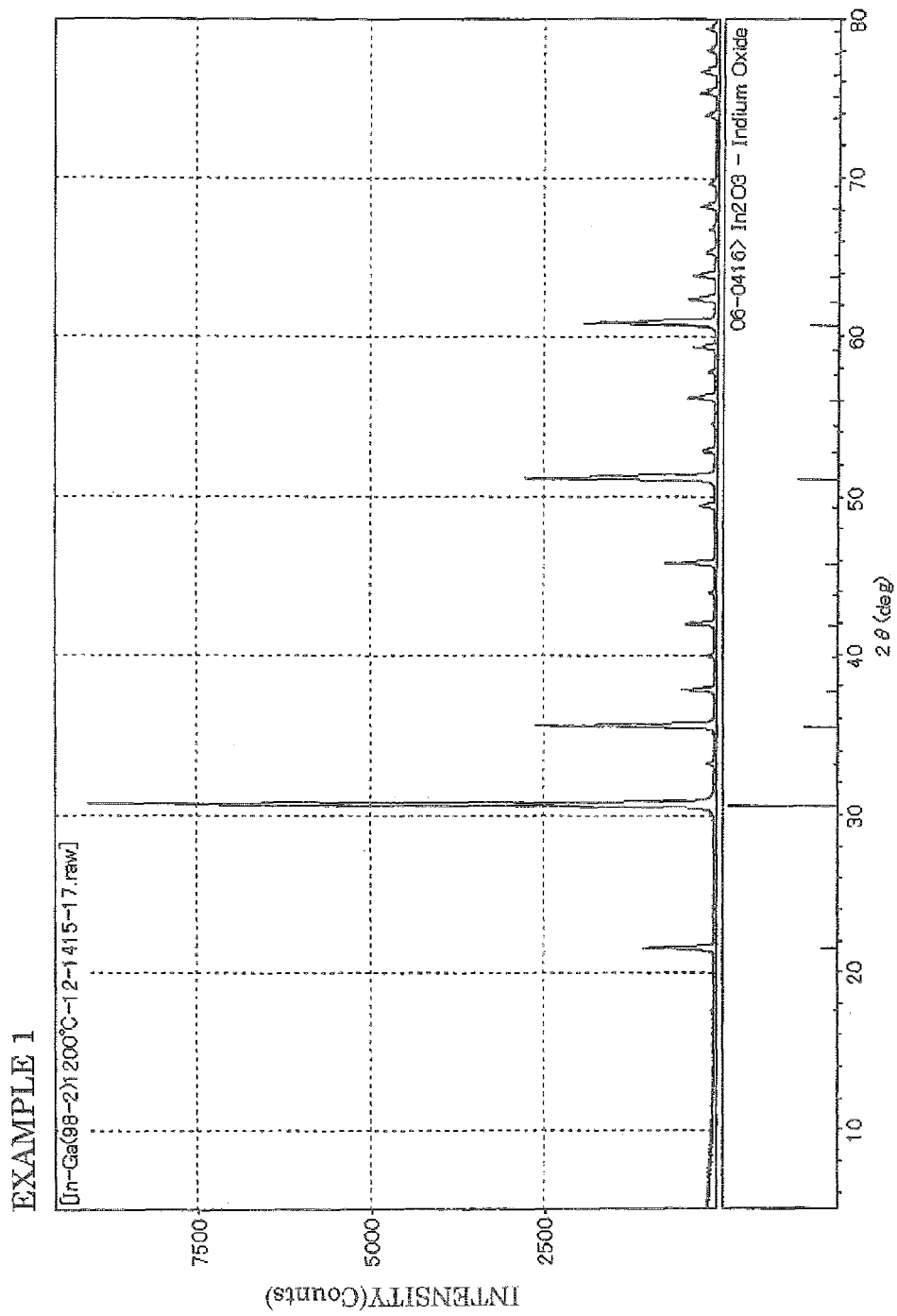
FIG. 1 shows an X-ray diffraction chart of an oxide sintered body produced in Example 1.
Figure 2:
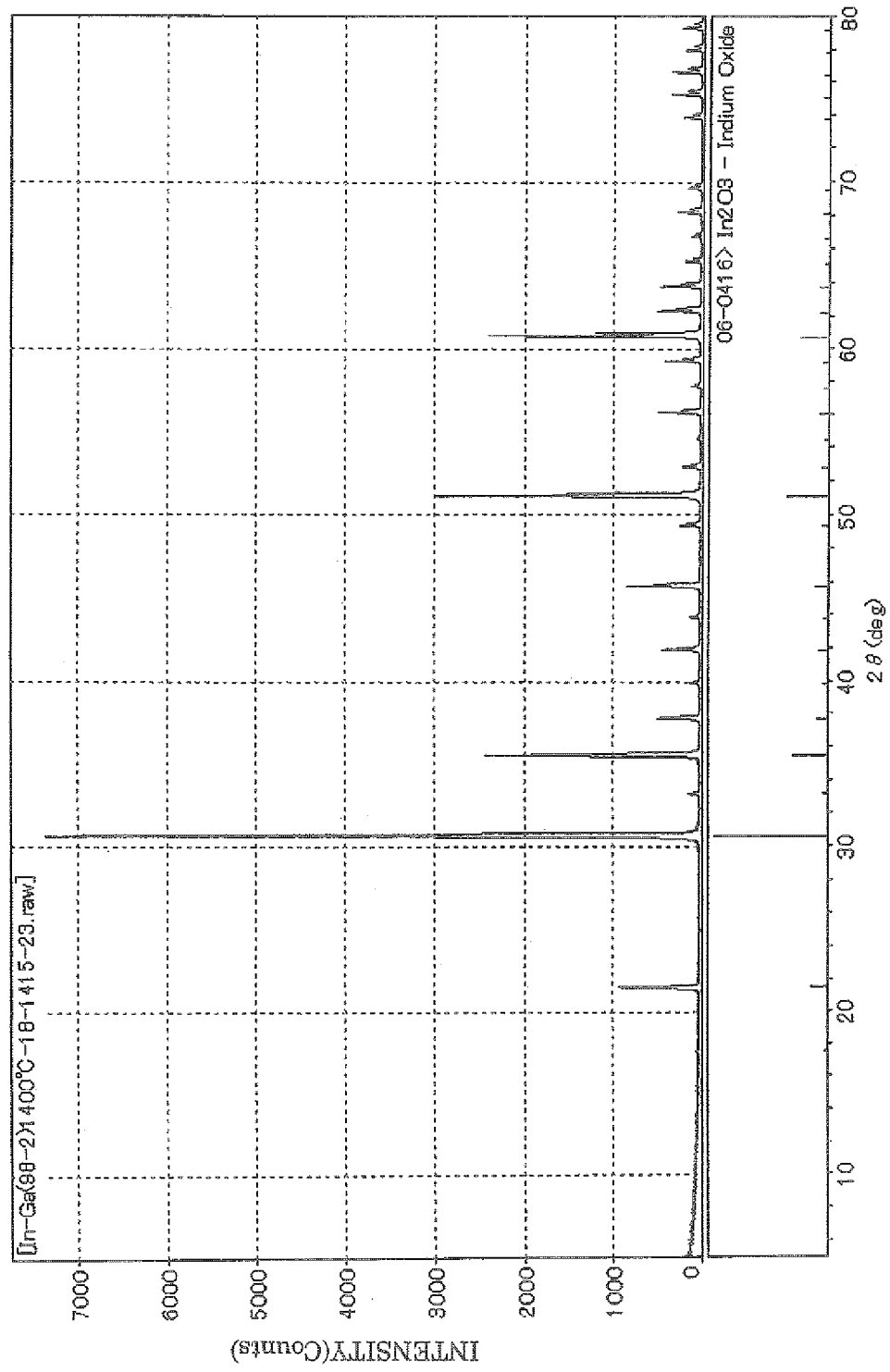
FIG. 2 shows an X-ray diffraction chart of an oxide sintered body produced in Example 2.
Figure 3:
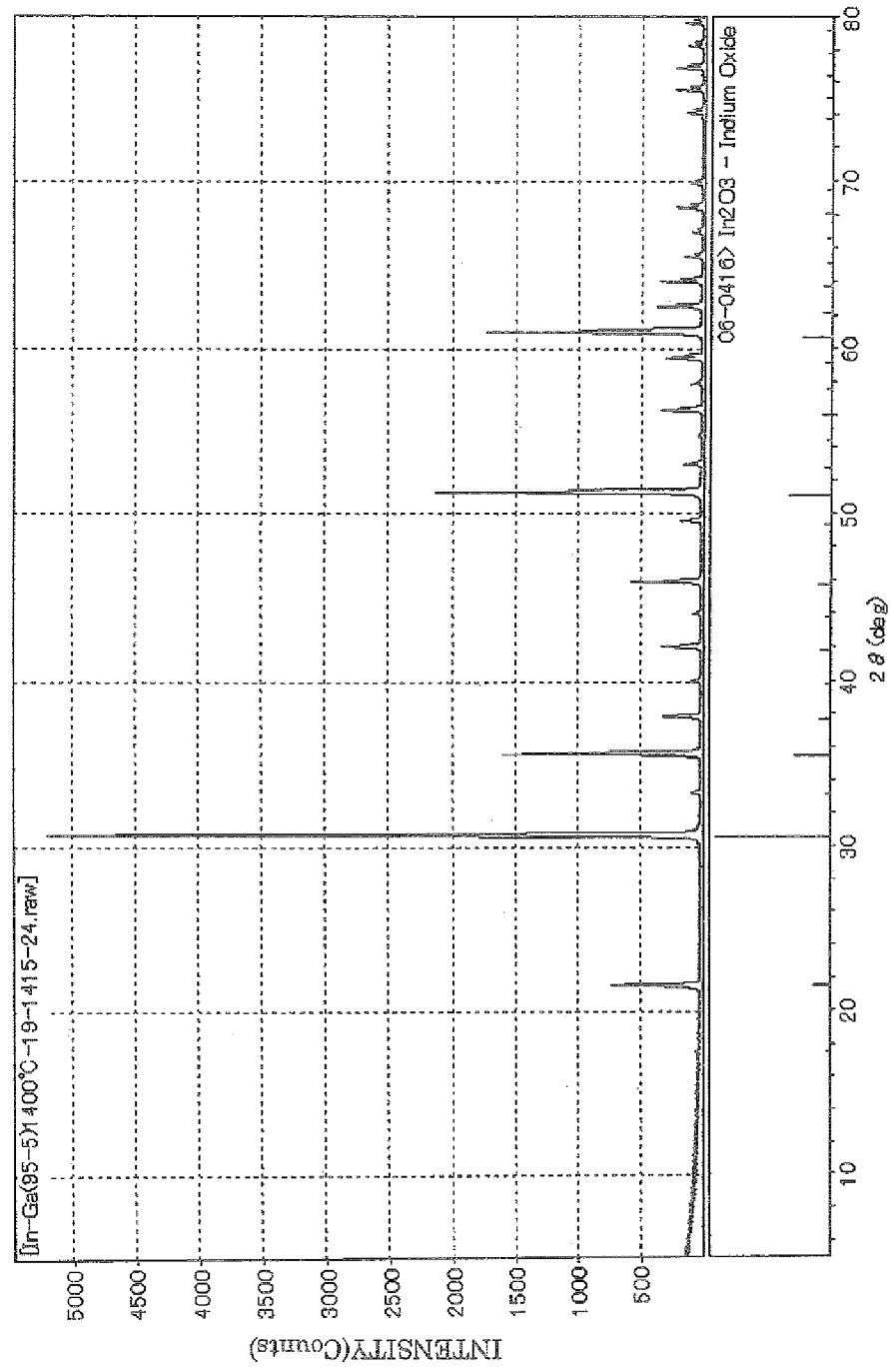
FIG. 3 shows an X-ray diffraction chart of an oxide sintered body produced in Example 3.
Figure 4:
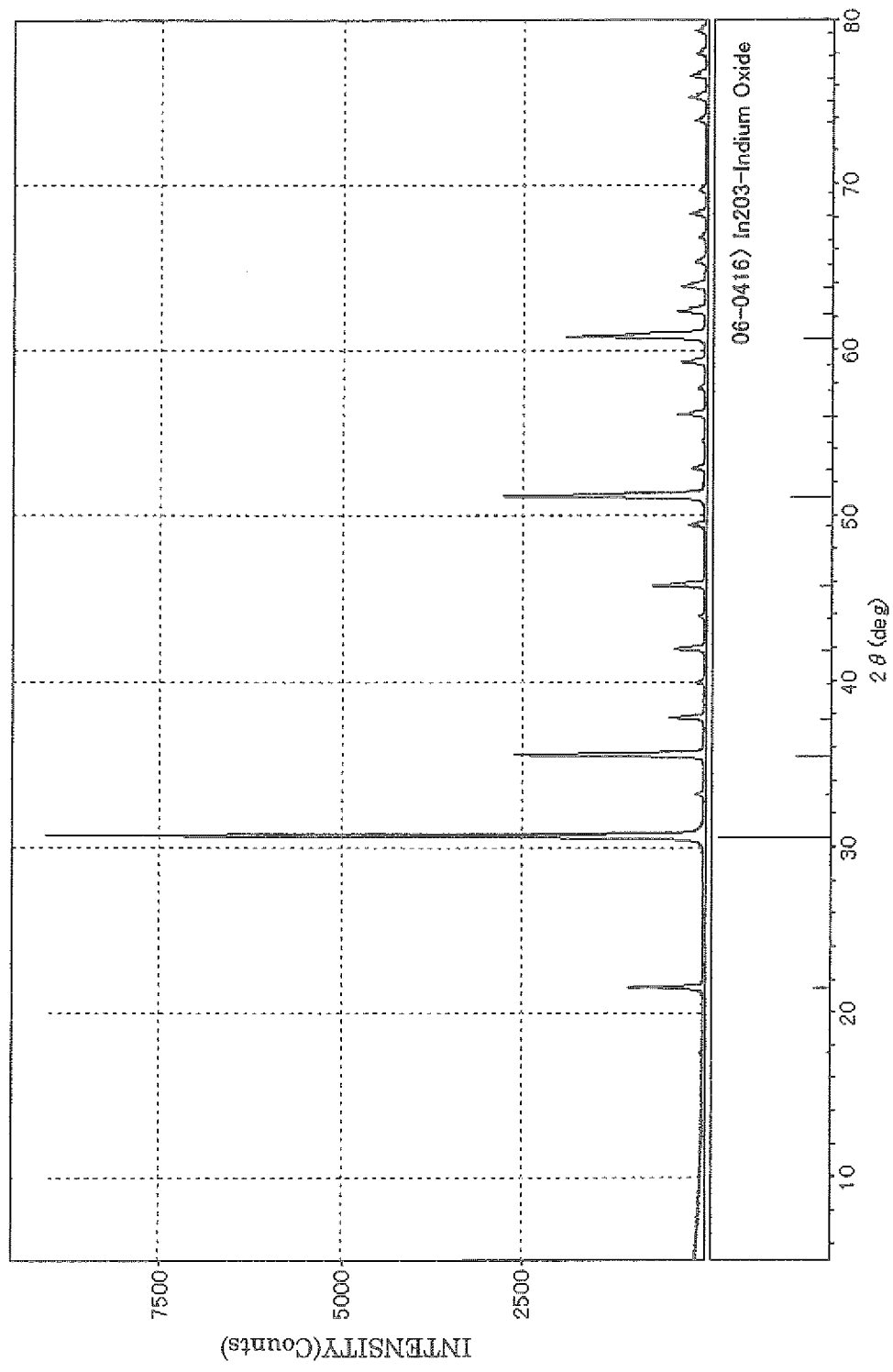
FIG. 4 shows an X-ray diffraction chart of an oxide sintered body produced in Example 4.
Figure 5:
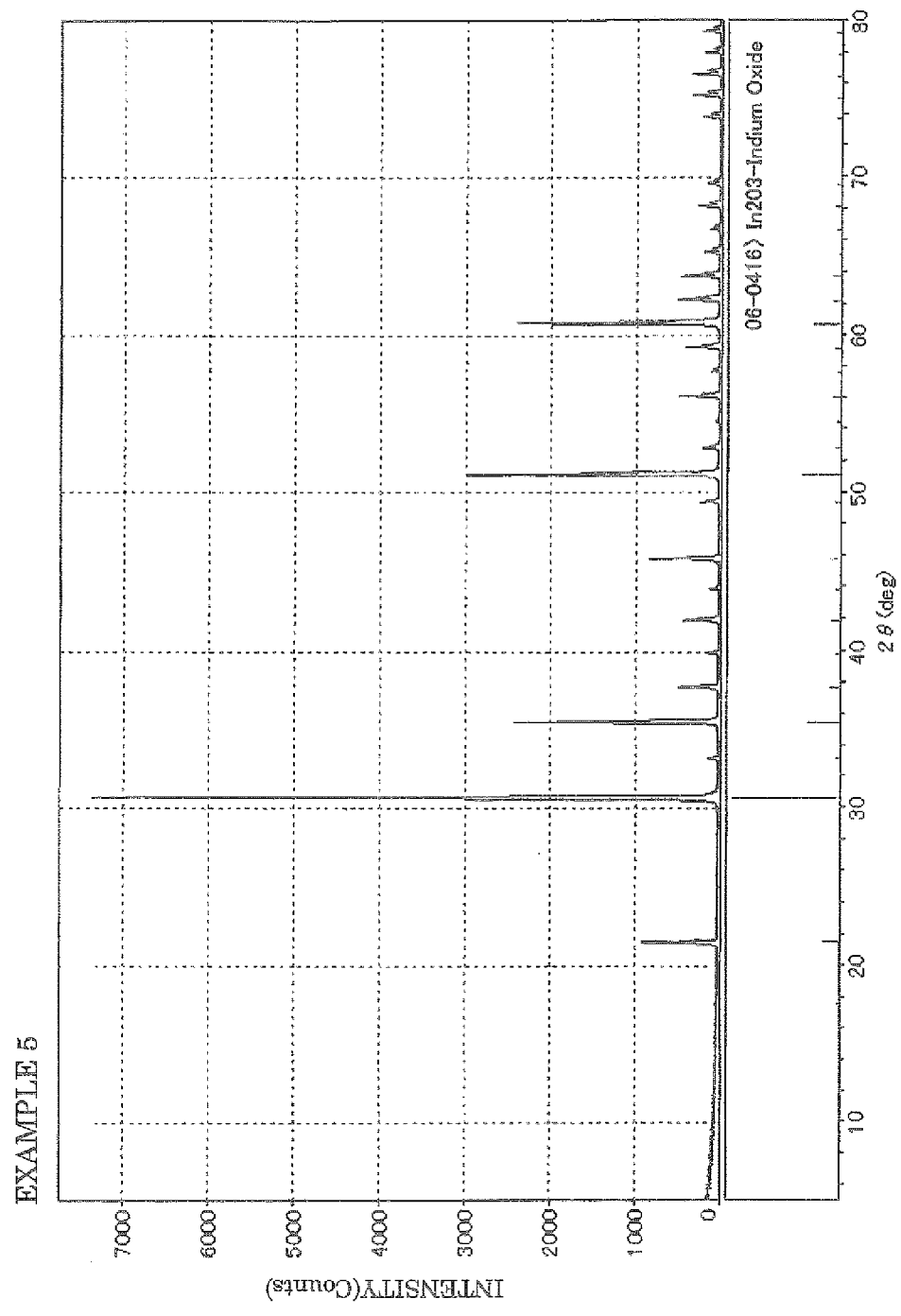
FIG. 5 shows an X-ray diffraction chart of an oxide sintered body produced in Example 5.
Figure 6:
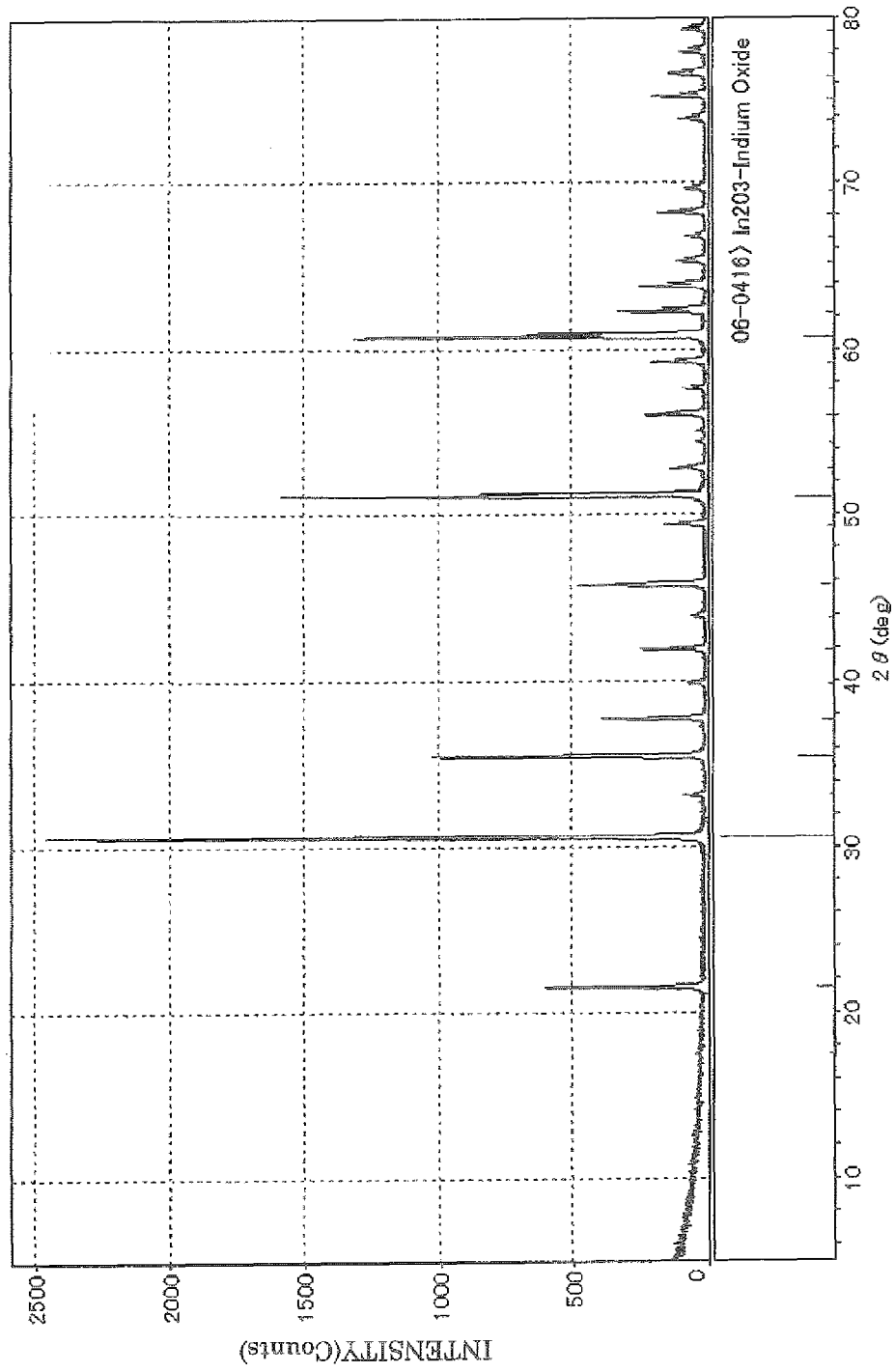
FIG. 6 shows an X-ray diffraction chart of an oxide sintered body produced in Example 6.
Figure 7:
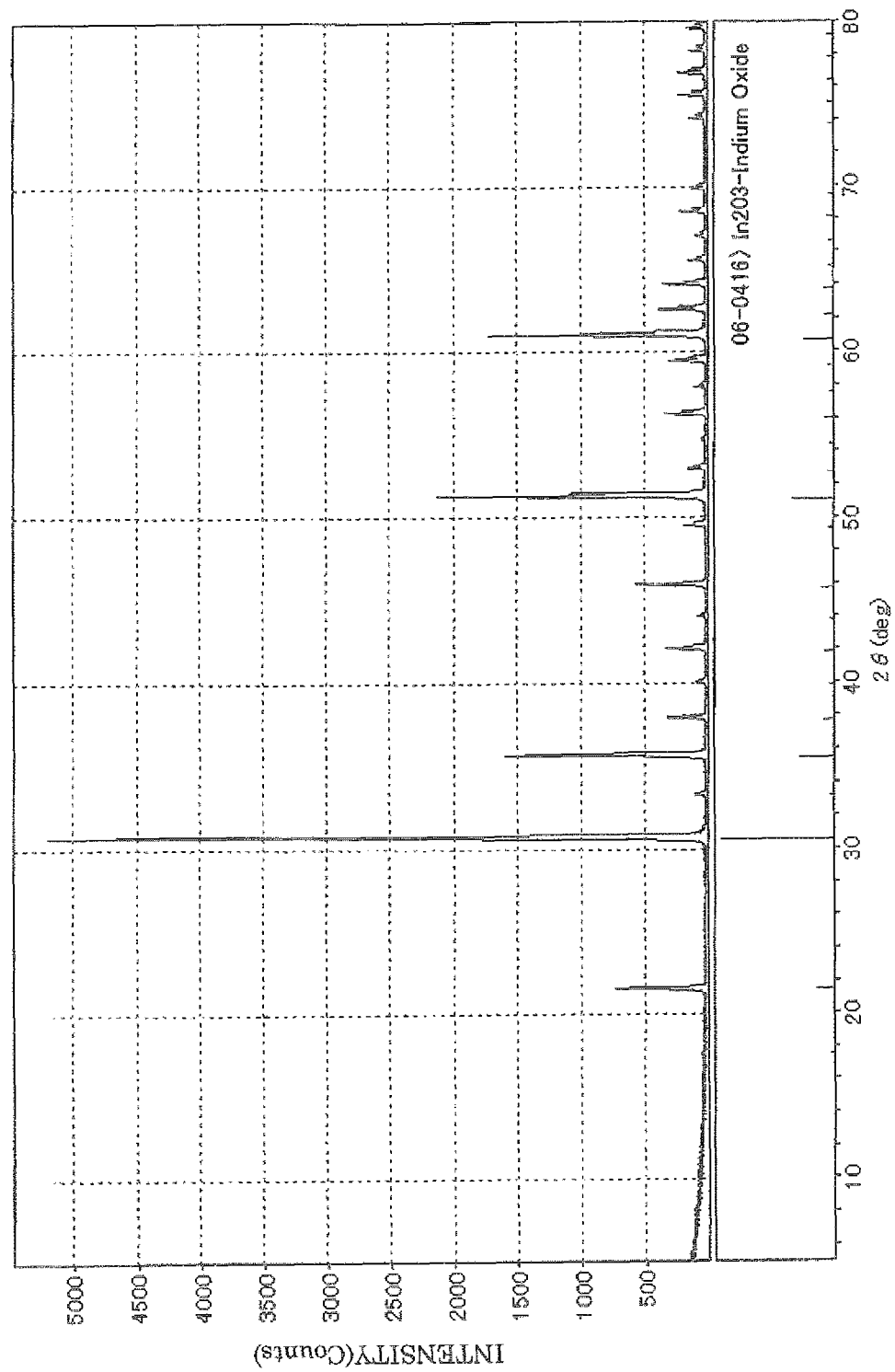
FIG. 7 shows an X-ray diffraction chart of an oxide sintered body produced in Example 7.
Figure 8:
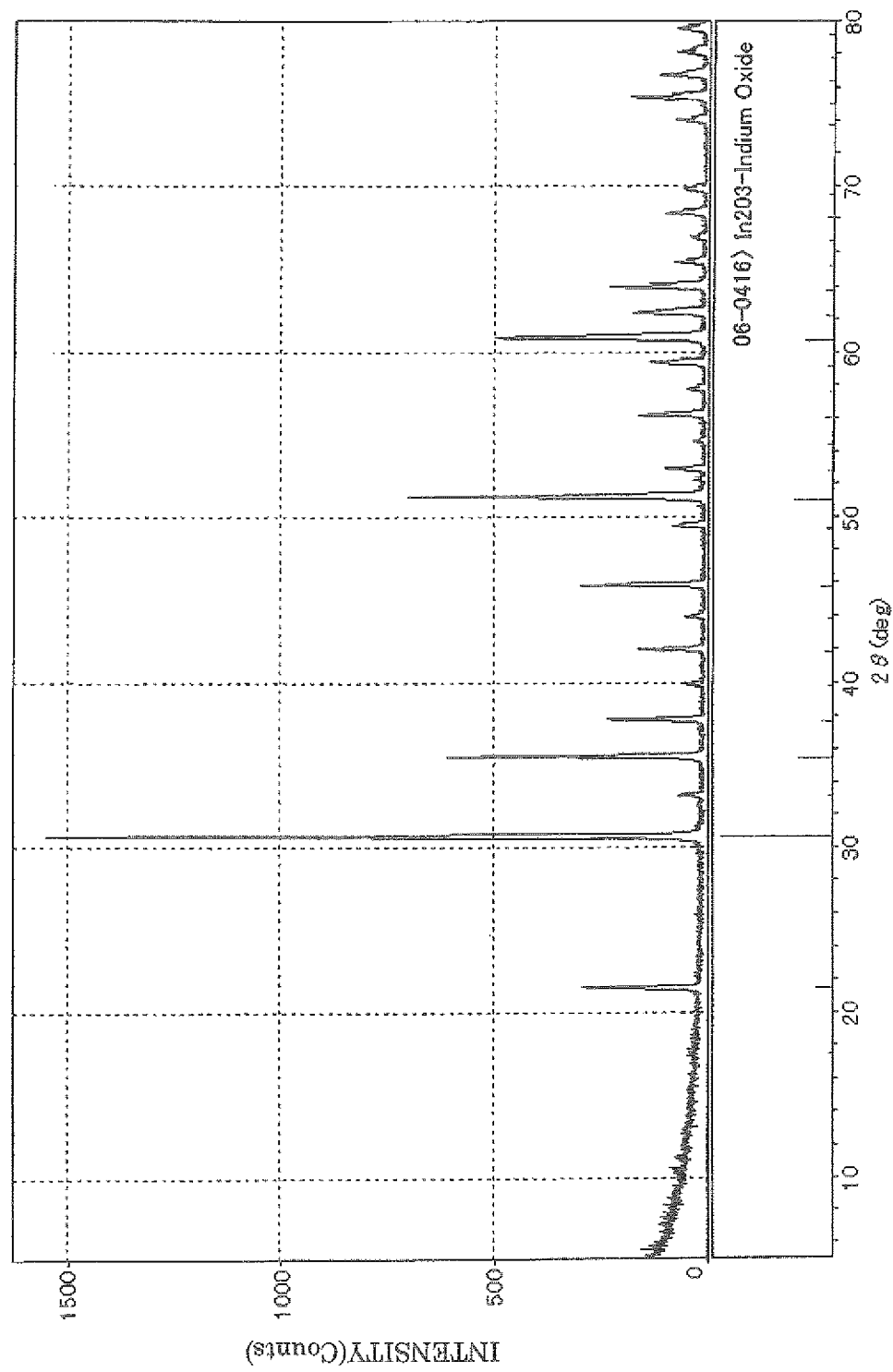
FIG. 8 shows an X-ray diffraction chart of an oxide sintered body produced in Example 8.

An oxide sintered body according to one embodiment of the invention includes indium oxide and gallium solid-solved therein. The oxide sintered body contains indium and gallium in an amount of 80 atom % or more based on total metal atoms. The oxide sintered body has an atomic ratio "Ga/(In+Ga)" of 0.001 to 0.12. When the atomic ratio "Ga/(In+Ga)" is within this range, gallium is almost completely solid-solved in indium oxide. An element (e.g., gallium) other than indium is preferably introduced as an ion at the position of indium included in the crystal lattice of indium oxide.

If the atomic ratio "Ga/(In+Ga)" is less than 0.001, the lattice constant of the indium oxide crystal may change to only a small extent, so that an effect may not be obtained by adding gallium. If the atomic ratio "Ga/(In+Ga)" exceeds 0.12, $InGaO_3$ or the like may precipitate. The resulting oxide thin film may be crystallized to only a smaller extent when more InGaO$_3$ or the like has precipitated, so that a crystalline thin film may not be obtained.

The atomic ratio "Ga/(In+Ga)" is preferably 0.001 to 0.10, and more preferably 0.005 to 0.08. The atomic ratio "Ga/(In+Ga)" is still more preferably 0.01 to 0.05, and particularly preferably 0.02 to 0.04.

The oxide sintered body according to one embodiment of the invention preferably has an In$_2$O$_3$ bixbyite structure. The oxide sintered body more preferably has a single-phase In$_2$O$_3$ bixbyite structure. In this case, since gallium (Ga) is completely solid-solved and dispersed in the In$_2$O$_3$ bixbyite structure, an abnormal discharge rarely occurs when using the oxide sintered body as a sputtering target. The bixbyite structure preferably accounts for 90% or more, more preferably 95% or more, and particularly preferably 97% or more, of the entire crystal structure. The ratio of crystal structures may be determined by identifying a crystal phase by EPMA analysis, and analyzing an image thereof.

In the oxide sintered body according to one embodiment of the invention, the bixbyite structure preferably has a lattice constant of 10.05 Å or more and less than 10.118 Å. The bixbyite structure may be determined by X-ray diffraction.

The oxide sintered body according to one embodiment of the invention preferably has a density of 6.5 to 7.2 g/cm$^3$. If the oxide sintered body has a low density, the surface of a sputtering target formed of the oxide sintered body may blacken, for example. This may induce an abnormal discharge, so that the sputtering rate may decrease.

The density of the sintered body may be increased by homogenously mixing raw materials having a particle size of 10 μm or less. If the particle size is too large, a reaction between the indium compound and the gallium compound may not proceed. If the raw materials are not homogenously mixed, the density of the sintered body may not increase due to the presence of unreacted particles or abnormally grown particles.

In the oxide sintered body according to one embodiment of the invention, gallium aggregates dispersed in indium oxide preferably have a diameter of less than 1 μm. The expression "gallium aggregates are dispersed in indium oxide" used herein means that gallium ions are solid-solved in the indium oxide crystal, or gallium compound particles are finely dispersed in indium oxide particles. A stable sputtering discharge occurs when gallium is finely dispersed. The diameter of gallium aggregates may be measured using an electron probe microanalyser (EPMA).

The oxide sintered body according to one embodiment of the invention preferably has a bulk resistivity of 10 mΩcm or less. When gallium is not completely solid-solved (i.e., Ga$_2$O$_3$ or the like is observed), an abnormal discharge may occur. The oxide sintered body more preferably has a bulk resistivity of 5 mΩcm or less. There is no particular lower limit but the oxide sintered body need not have a bulk resistivity of less than 1 mΩcm.

The oxide sintered body according to one embodiment of the invention preferably has a content of metal ions having a positive valence of 4 or more (e.g., tin, titanium, zirconium, and germanium) of 100 ppm or less. If the content of metal ions having a positive valence of 4 or more exceeds 100 ppm, the resulting crystalline oxide thin film may exhibit conductivity instead of semiconductivity. The content of metal ions having a positive valence of 4 or more is more preferably 50 ppm or less, and still more preferably 30 ppm or less.

The impurity content may be reduced to 100 ppm or less by utilizing a raw material having a purity of 99.99% or more.

An indium oxide raw material may include metals having a positive valence of 4 or more (particularly tin) in an amount of 100 ppm or more. In this case, such metals may produce carriers in the resulting thin film, so that it may be impossible to use the thin film as a semiconductor.

The oxide sintered body according to one embodiment of the invention preferably has a content of metal ions (e.g., zinc, magnesium, copper, iron, nickel, and cobalt) having a positive valence of 2 or less of 100 ppm or less. If the content of metal ions having a positive valence of 2 or less is 100 ppm or more, the resulting oxide semiconductor may exhibit a low mobility.

It is preferable that the content of metal ions having a positive valence of 4 be equal to or lower than the content of metal ions having a positive valence of 2.

If the content of metal ions having a positive valence of 4 is higher than the content of metal ions having a positive valence of 2, the indium oxide crystal may be doped with metal ions having a positive valence of 4 so that the carrier density may increase. As a result, the resulting oxide thin film may exhibit high conductivity instead of semiconductivity. The content of metal ions having a positive valence of 2 or less is more preferably 50 ppm or less, and still more preferably 30 ppm or less.

The oxide sintered body according to one embodiment of the invention preferably further includes one or two or more oxides selected from yttrium oxide, scandium oxide, aluminum oxide, and boron oxide. The oxide sintered body preferably has a content of such oxides of 0.01 to 5 atom %. If the oxide sintered body includes such oxides, a thin film obtained using the oxide sintered body as a sputtering target has a lattice constant smaller than that of a thin film formed only of indium oxide (i.e., the intermetallic distance decreases). This increases the mobility of a thin film transistor produced using such a thin film.

A method of producing an oxide sintered body according to one embodiment of the invention includes (a) mixing an indium (In) compound powder having an average particle size of less than 2 μm with a gallium (Ga) compound powder having an average particle size of less than 2 μm in an atomic ratio "Ga/(In+Ga)" of 0.001 to 0.12 (hereinafter may be referred to as "mixing step"); (h) shaping the resulting mixture to obtain a shaped product (hereinafter may be referred to as "shaping step"); and (c) firing the shaped product at 1200 to 1600° C. for 2 to 96 hours (hereinafter may be referred to as "sintering step").

The average particle size refers to a value measured in accordance with JIS R 1619.

The indium compound and the gallium compound included in the raw material powders used in the mixing step are either an oxide or a compound (oxide precursor) that becomes an oxide due to firing. Examples of an indium oxide precursor and a tin oxide precursor include a sulfide, a sulfate, a nitrate, a halide (e.g., chloride and bromide), a carbonate, an organic acid salt (e.g., acetate, propionate, and naphthenate), an alkoxide (e.g., methoxide and ethoxide), an organic metal complex (e.g., acetylacetonate), and the like of indium or tin.

Among these, a nitrate, an organic acid salt, an alkoxide, or an organic metal complex is preferable since these compounds are completely pyrolyzed at a low temperature so that impurities do not remain. It is optimum to use oxides of the respective metals.

The purity of each raw material is normally 99.9 mass % (3N) or more, preferably 99.99 mass % (4N) or more, more preferably 99.995 mass % or more, and particularly preferably 99.999 mass % (5N) or more. If the purity of each raw material is 99.9 mass % (3N) or more, a deterioration in semiconductor properties due to impurities (e.g., metals having a positive valence of 4 or more, Fe, Ni, and Cu) does not occur, so that sufficient reliability can be achieved. It is particularly preferable that the content of Na, K, and Ca be 100 ppm or less in order to prevent a situation in which the electrical resistance of the resulting thin film deteriorates with time.

The raw material powders are preferably mixed by (i) a solution method (coprecipitation method) or (ii) a physical mixing method. It is more preferable to mix the raw material powders by the physical mixing method in order to reduce cost.

When using the physical mixing method, the raw material powder including the indium compound and the raw material powder including the gallium compound are put in a mixer (e.g., ball mill, jet mill, pearl mill, or bead mill), and uniformly mixed.

The raw material powders are preferably mixed for 1 to 200 hours. If the mixing time is less than 1 hour, the elements may not be uniformly dispersed. If the mixing time exceeds 200 hours, the productivity may decrease. The mixing time is particularly preferably 10 to 60 hours.

It is preferable that a raw material powder mixture obtained by mixing the raw material powders have an average particle size of 0.01 to 1.0 μm. If the average particle size of the raw material powder mixture is less than 0.01 μm, the powders may aggregate (i.e., the handling capability may deteriorate). Moreover, a dense sintered body may not be obtained. If the average particle size of the raw material powder mixture exceeds 1.0 μm, a dense sintered body may not be obtained.

The method may include prefiring the mixture obtained by mixing the raw material powders.

The density of the resulting sputtering target can be easily increased by prefiring the mixture.

In the prefiring step, the mixture obtained by the step (a) is preferably heated at 200 to 1000° C. for 1 to 100 hours (more preferably 2 to 50 hours). The raw material compounds are sufficiently pyrolyzed by heating the mixture at 200° C. or more for 1 hour or more. A situation in which the particles become rough and large is prevented by heating the mixture at 1000° C. or less for 100 hours or less.

It is preferable to grind the prefired mixture before the shaping step and the sintering step. The prefired mixture is preferably ground using a ball mill, a roll mill, a pearl mill, a jet mill, or the like. The ground mixture after prefiring preferably has an average particle size of 0.01 to 3.0 μm, and more preferably 0.1 to 2.0 μm, for example. If the ground mixture after prefiring has an average particle size of 0.01 μm or more, the mixture has a sufficient bulk specific gravity, and can be easily handled. If the ground mixture after prefiring has an average particle size of 3.0 μm or less, the density of the resulting sputtering target can be easily increased. The average particle size of the raw material powder may be measured in accordance with JIS R 1619.

The raw material powder mixture may be shaped by pressing, cold isostatic pressing, or the like.

When shaping the raw material powder mixture by pressing, a cold pressing method, a hot pressing method, or the like may be employed. For example, a die is filled with the powder mixture, and the powder mixture is pressed using a cold press machine. The powder mixture is pressed at room temperature (25° C.) under a pressure of 100 to 100,000 kg/cm$^2$, for example.

The resulting raw material powder shaped product is then fired to produce an oxide sintered body.

The sintering temperature is 1200 to 1600° C., preferably 1250 to 1580° C., and particularly preferably 1300 to 1550° C.

If the sintering temperature is within the above range, gallium is easily solid-solved in indium oxide, so that the bulk resistivity of the resulting oxide sintered body can be reduced.

If the sintering temperature is 1600° C. or less, evaporation of gallium can be suppressed.

The sintering time is preferably 2 to 96 hours, and more preferably 10 to 72 hours.

If the sintering time is 2 hours or more, the sintered density of the resulting oxide sintered body can be improved, so that the surface of the oxide sintered body can be processed. If the sintering time is 96 hours or less, the formed product can be appropriately sintered.

The shaped product is preferably sintered in an oxygen gas atmosphere. The density of the resulting oxide sintered body can be increased by sintering the shaped product in an oxygen gas atmosphere, so that an abnormal discharge during sputtering of the oxide sintered body can be suppressed. The oxygen gas atmosphere preferably has an oxygen concentration of 10 to 100 vol %, for example. Note that the shaped product may be sintered in a non-oxidizing atmosphere (e.g., under vacuum or in a nitrogen atmosphere).

The formed product may be sintered under atmospheric pressure or an increased pressure. The pressure is 9800 to 1,000,000 Pa, and preferably 100,000 to 500,000 Pa, for example.

The oxide sintered body according to one embodiment of the invention may be produced by the above method. The oxide sintered body according to one embodiment of the invention may be used as a sputtering target. Since the oxide sintered body according to one embodiment of the invention has high conductivity, a DC sputtering method that achieves a high deposition rate can be applied when using the oxide sintered body as a sputtering target.

An arbitrary sputtering method (e.g., RF sputtering method, AC sputtering method, pulsed DC sputtering method) may be applied to the sputtering target according to one embodiment of the invention in addition to the DC sputtering method without causing an abnormal discharge.

An oxide thin film may be produced by vapor deposition, sputtering, ion plating, pulsed laser deposition, or the like using the above oxide sintered body. Examples of the sputtering method include an RF magnetron sputtering method, a DC magnetron sputtering method, an AC magnetron sputtering method, a pulsed DC magnetron sputtering method, and the like.

A mixed gas of argon and an oxidizing gas may be used as a sputtering gas. Examples of the oxidizing gas include $O_2$, $CO_2$, $O_3$, $H_2O$, and the like. It is preferable to adjust the partial pressure of oxygen during sputtering to 0.1 to 20%. If the partial pressure of oxygen is less than 0.1%, a transparent amorphous film immediately after film formation may have conductivity, and may not be able to be used as an oxide semiconductor. If the partial pressure of oxygen exceeds 20%, the resulting transparent amorphous film may have insulating properties, and may not be able to be used as an oxide semiconductor. The partial pressure of oxygen is more preferably 1 to 10%.

An oxide thin film according to one embodiment of the invention includes indium oxide and gallium solid-solved therein, and contains gallium and indium in an amount of 80 atom % or more based on total metal atoms. The oxide thin film has an atomic ratio "Ga/(Ga+In)" of 0.001 to 0.12. The oxide thin film preferably has an atomic ratio "Ga/(Ga+In)" of 0.001 to 0.10, and particularly preferably 0.005 to 0.08.

Gallium oxide reduces the lattice constant (i.e., increases the mobility) of indium oxide. Gallium oxide has a high ability to bond to oxygen, and reduces oxygen deficiency of a polycrystallized indium oxide thin film. Gallium oxide has a site that is completely solid-solved in indium oxide, and completely integrated with crystallized indium oxide to reduce the lattice constant of indium oxide. When gallium oxide is added in an amount that exceeds the solid-solubility limit, precipitated gallium oxide may cause electron scattering, or may hinder crystallization of indium oxide.

The oxide thin film according to one embodiment of the invention has a single-phase bixbyite structure, and the bixbyite structure preferably has a lattice constant of 10.01 Å or more and less than 10.118 Å (note that the lower limit of the lattice constant is not particularly limited). A small lattice constant means that the crystal lattice is reduced, and the intermetallic distance is short. The moving speed of electrons along the orbital of the metal increases due to a decrease in intermetallic distance, so that the mobility of the resulting thin film transistor increases. If the lattice constant is too large (i.e., is almost equal to that of the crystal lattice of indium oxide), the mobility is not improved.

In the oxide thin film according to one embodiment of the invention, gallium aggregates dispersed in indium oxide preferably have a diameter of less than 1 μm.

The oxide thin film according to one embodiment of the invention preferably further includes one or two or more oxides selected from yttrium oxide, scandium oxide, aluminum oxide, and boron oxide. The oxide thin film preferably has a content of such oxides of 0.01 to 5 atom %. These oxides have a site that is completely solid-solved in indium oxide in the same manner as gallium oxide, and completely integrated with crystallized indium oxide to reduce the lattice constant of indium oxide. The degree of 5 s orbital overlap of indium in the crystal increases due to a decrease in lattice constant, so that the mobility is expected to be improved.

The oxide thin film according to one embodiment of the invention may be produced using the sputtering target according to one embodiment of the invention.

A sputtering target having a low gallium concentration is used when forming a crystalline film since a film having a low gallium concentration is easily crystallized. A sputtering target having a high gallium concentration is used when forming a non-crystalline film since a film having a high gallium concentration tends to become non-crystalline. Specifically, an amorphous film and a crystalline film can be formed when the Ga ratio is about 0.05 to 0.12, and a crystalline film is formed when the Ga ratio is about 0.05 or less. These thin films are formed by almost the same method.

A crystalline film is obtained when using a sputtering target having an atomic ratio "Ga/(In+Ga)" of less than 0.05 (i.e., low gallium concentration).

Note that an amorphous film may be formed as follows using a sputtering target having an atomic ratio "Ga/(In+Ga)" of less than 0.05 in order to improve uniformity of the thin film. For example, an amorphous film may be formed by adjusting the sputtering conditions, such as setting the substrate temperature to a temperature equal to or lower than room temperature, adding steam to the sputtering gas at 0.1 Pa or less, or setting the sputtering gas pressure to 5 Pa or more. A crystalline film may be obtained by subjecting the amorphous film to an additional heating step described later.

When forming a crystalline film using a sputtering target having an atomic ratio "Ga/(In+Ga)" of 0.05 or more and less than 0.12 (i.e., high gallium concentration), the substrate temperature during film formation is preferably set within the range from room temperature to 450° C. Specifically, cost increases when cooling the substrate to a temperature lower than room temperature, and the apparatus cost increases when heating the substrate to a temperature higher than 450° C. The substrate temperature during film formation is more preferably set within the range from room temperature (i.e., the substrate is not heated) to 200° C. When continuously performing the sputtering process, the substrate may be heated due to plasma during sputtering. In this case, it is preferable to cool the substrate to about room temperature during sputtering when using a film substrate or the like.

When the substrate is not heated during film formation, it is necessary to perform the additional heating step to effect crystallization. Note that the additional heating step may also be performed when heating the substrate during film formation.

When the substrate or the like on which the oxide thin film is formed is heated to 150 to 450° C., the thin film is crystallized, and exhibits semiconductor properties. If the heating temperature is lower than 150° C., the thin film may not be sufficiently crystallized. As a result, the insulating properties of the thin film may be impaired, so that leakage may occur. If the heating temperature is 450° C. or higher, the substrate may warp, or the thin film layers may be removed from each other when fabricating a semiconductor device. The heating temperature is more preferably 200 to 350° C., and still more preferably 240 to 300° C.

The heating time is preferably 0.5 to 120 minutes. The oxide thin film is sufficiently crystallized by high-power heating (e.g., laser heating) within about 0.5 minutes. If the heating time is less than 0.5 minutes, the oxide thin film may not be sufficiently crystallized. If the heating time exceeds 120 minutes, cost may increase. The heating time is more preferably 0.5 to 90 minutes, and still more preferably 1 to 60 minutes.

The heating atmosphere is not particularly limited, but is preferably air, an oxygen atmosphere, a nitrogen atmosphere, or a low-vacuum atmosphere. Among these, air and an oxygen atmosphere are more preferable due to ease of carrier control. It is conjectured that excessive oxygen and water in a crystalline oxide semiconductor thin film are exchanged for oxygen in the atmosphere. Therefore, an oxygen-containing atmosphere is preferable in order to stabilize the semiconductor properties. Note that oxygen deficiency may completely disappear when heating the oxide thin film at a high temperature in pure oxygen, so that an insulator may be obtained. The oxygen concentration is preferably 19 to 50%.

The oxide thin film according to one embodiment of the invention may be used for a thin film transistor. In particular, the oxide thin film may be used as a channel layer. The oxide thin film may be used either directly or after heating.

A thin film transistor according to one embodiment of the invention may be a channel-etch thin film transistor. The thin film according to one embodiment of the invention is crystalline, and has durability. Therefore, when producing a thin film transistor using the thin film according to one embodiment of the invention, it is possible to employ a photolithographic process that forms source/drain electrodes and a channel region by etching a metal (e.g., Al) thin film.

The thin film transistor according to one embodiment of the invention may be an etch-stopper thin film transistor. In this case, since a channel region formed of the semiconductor layer (i.e., the thin film according to one embodiment of the invention) can be protected by an etch stopper, and a large amount of oxygen can be introduced into the semiconductor film during film formation, it is unnecessary to externally supply oxygen through the etch stopper layer. Since the thin film is an amorphous film immediately after film formation, the source/drain electrodes and the channel region can be formed by etching a metal (e.g., Al) thin film while etching the semiconductor layer, so that the time required for the photolithographic process can be reduced.

A method of producing a thin film transistor according to one embodiment of the invention includes forming an oxide thin film using the sputtering target according to one embodiment of the invention, heating the oxide thin film in an oxygen atmosphere, and forming an oxide insulator layer on the oxide thin film that has been heated. The oxide thin film is crystallized by heating the oxide thin film.

The oxide insulator layer is preferably formed on the oxide thin film that has been heated in order to prevent deterioration in semiconductor properties with time.

The oxide thin film is preferably deposited using a film forming gas having an oxygen content of 10 vol % or more. A mixed gas of argon and oxygen is used as the film forming gas, for example.

The subsequent crystallization can be stabilized by adjusting the oxygen content in the film forming gas to 10 vol % or more. If the oxygen content in the sputtering gas is less than 10 vol %, it is necessary to externally supply oxygen required for crystallization, so that oxygen deficiency in the semiconductor may completely disappear. In the case where such a deficiency, the crystal may not be grown normally, and may include a scattering factor, so that a decrease in mobility may occur.

The upper limit of the oxygen content in the film forming gas is not particularly limited. However, the sputtering rate may decrease when the oxygen content in the film forming gas is 100 vol %. Therefore, the oxygen content in the film forming gas is preferably adjusted to 50 vol % or less. The oxygen content in the film forming gas is more preferably 40 vol % or less, and still more preferably 30 vol % or less. A large amount of excessive oxygen introduced into the semiconductor is easily discharged to the outside during the subsequent crystallization step, so that an indium oxide crystal thin film with a small number of lattice deficiencies can be obtained.

The oxide thin film may be crystallized in the presence or absence of oxygen using a lamp annealing apparatus, a laser annealing apparatus, a thermal plasma apparatus, a hot-blast heating apparatus, a contact heating apparatus, or the like. In this case, it is preferable to employ a high temperature rise rate. If the temperature rise rate is low, the crystal particles may be abnormally grown. As a result, lattice shear may increase at the interface between the particles, and may cause scattering. It is possible to produce small crystal particles and reduce lattice shear by crystallizing the oxide thin film within a short time, so that the effect of improving the mobility is enhanced. Lattice shear may be considered to be a mismatch in crystal orientation at the interface between crystals that differ in crystal orientation. Scattering occurs to only a small extent when the crystal particles have similar crystal orientations.

The temperature rise rate is normally 40° C./min or more, preferably 70° C./min or more, more preferably 80° C./min or more, and still more preferably 100° C./min or more. The upper limit of the temperature rise rate is not particularly limited. When subjecting the oxide thin film to laser heating or thermal plasma heating, the temperature of the oxide thin film can be instantaneously increased to the desired heating temperature.

It is also preferable to employ a high cooling rate. However, if the cooling rate is too high, the substrate may break, or the electrical properties of the thin film may deteriorate due to residual internal stress. If the cooling rate is too low, the crystal may be abnormally grown due to an annealing effect. It is preferable to set the cooling rate in the same manner as the temperature rise rate (heating rate). The cooling rate is normally 5 to 300° C./min, preferably 10 to 200° C./min, and more preferably 20 to 100° C./min.

The oxide thin film is preferably heated at 250 to 500° C. for 0.5 to 1200 minutes. If the heating temperature is lower than 250° C., the oxide thin film may not be crystallized. If the heating temperature exceeds 500° C., the substrate and the semiconductor film may be damaged. If the heating time is less than 0.5 minutes, the oxide thin film may not be crystallized because of too short heating time. It may take time to crystallize the oxide thin film when the heating time exceeds 1200 minutes.

EXAMPLES

The invention is further described below by way of examples and comparative examples. Note that the invention is not limited to the following examples. The invention also includes various modifications and other examples that are based on the technical concept of the invention.

Examples 1 to 8

Production of Oxide Sintered Body

The following oxide powders were used as the raw material powders. The average particle size of the raw material powder was measured using a laser diffraction particle size distribution analyzer "SALD-300V" (manufactured by Shimadzu Corporation), and the specific surface area of the raw material powder was measured by the BET method.
(a) Indium oxide powder (specific surface area: 6 $m^2/g$, average particle size: 1.2 µm)
(b) Gallium oxide powder (specific surface area: 6 $m^2/g$, average particle size: 1.5 µm)
The raw material powder mixture of the powders (a) and (b) had a specific surface area of 6.0 $m^2/g$.

The above powders were weighed in a Ga/(In+Ga) ratio shown in Table 1, and mixed and ground using a wet stirred media mill. Zirconia beads having a diameter of 1 mm were used as the media. The specific surface area of the raw material powder mixture was increased by 2 $m^2/g$ by grinding while checking the specific surface area of the raw material powder mixture.

The ground powder mixture was dried using a spray dryer, put in a die (diameter: 150 mm, thickness: 20 mm), and pressed using a cold press machine. The shaped product was sintered in an oxygen atmosphere (in which oxygen was circulated) at a temperature shown in Table 1 for 24 hours to obtain a sintered body.

The density of the sintered body was calculated from the weight and the external dimensions of the sintered body which had been cut to a given size. A sputtering target sintered body having a high density was thus obtained without performing a prefiring step.

The bulk resistivity (conductivity) (mΩcm) of the sintered body was measured by a four-probe method using a resistance meter ("Loresta" manufactured by Mitsubishi Chemical Corporation).

The impurity concentration in the sintered body was determined as follows.

Specifically, the sintered body was sampled, dissolved in water, and quantitatively analyzed by inductively coupled plasma (ICP) emission spectroscopy to determine the impurity concentration in the sintered body.

The evaluation results are shown in Table 1.

The sintered body was subjected to X-ray diffraction analysis. FIGS. 1 to 8 respectively show X-ray diffraction charts of Examples 1 to 8.

As a result of analyzing the X-ray diffraction charts, an $In_2O_3$ bixbyite structure was observed in the sintered bodies of Examples 1 to 8.

The lattice constants of the sintered bodies of Examples 1 to 8 were calculated from the X-ray diffraction analysis results. Table 1 shows the lattice constants of the sintered bodies of Examples 1 to 8 (lattice constant of cubic crystal of $In_2O_3$: 10.118 Å).

The X-ray diffraction (XRD) measurement conditions were as follows. Apparatus: "Ultima-III" manufactured by Rigaku Corporation
X-rays: Cu-Kα radiation (wavelength: 1.5406 Å, monochromatized using a graphite monochromator)
Output: 50 kV-120 mA
2θ-θ reflection method, continuous scan (1.0°/min)
Sampling interval: 0.02°
Slit DS, SS: 2/3°, RS: 0.6 mm The peak was separated, and the peak intensity was calculated from the area of the peak.

Dispersion of gallium was determined by the EPMA measurement of the sintered body. A gallium aggregate having a diameter of 1 μm or more was not observed.

The sintered body was cut, and bonded to a backing plate to obtain a sputtering target having a diameter of 4 inches. The sputtering target was installed in a DC sputtering apparatus, and a sputtering process was continuously performed using argon as a sputtering gas (0.3 Pa, DC output: 400 (10 kWhr). A change in voltage during sputtering was recorded (stored) in a data logger to determine the occurrence of an abnormal discharge. The occurrence of an abnormal discharge was determined by detecting an abnormal discharge by monitoring a change in voltage. The results are shown in Table 1. When a change in voltage that occurred within 5 minutes during the measurement was equal to or more than 10% of the constant voltage during sputtering, it was determined that an abnormal discharge occurred.

A micro-arc refers to an abnormal sputtering discharge that is detected when the sputtering voltage has changed by ±10% within 0.1 seconds. The device yield may decrease due to a micro-arc, and it may be difficult to implement mass production.

Examples 9 to 11

Production of Oxide Sintered Body

The following oxide powders were used as the raw material powders. The average particle size of the raw material powder was measured using a laser diffraction particle size distribution analyzer "SALD-300V" (manufactured by Shimadzu Corporation), and the specific surface area of the raw material powder was measured by the BET method.

(a) Indium oxide powder (specific surface area: 6 $m^2/g$, average particle size: 1.2 μm)
(b) Gallium oxide powder (specific surface area: 6 $m^2/g$, average particle size: 1.5 μm)
(c) Scandium oxide (specific surface area: 6 $m^2/g$, average particle size: 1.5 μm)
(d) Yttrium oxide (specific surface area: 6 $m^2/g$, average particle size: 1.5 μm)
(e) Aluminum oxide (specific surface area: 6 $m^2/g$, average particle size: 1.5 μm)

The powders (a), (b), and (c), (d), or (e) were weighed in a Ga/(In+Ga) ratio and an X/(In+Ga+X) ratio (X is an additive element) shown in Table 2, and mixed to obtain a raw material powder mixture. The raw material powder mixture had a specific surface area of 6.0 $m^2/g$.

A sintered body was produced and evaluated in the same manner as in Example 1, except for using the above raw material powder mixture, and sintering the shaped product at a temperature shown in Table 2. The results are shown in Table 2.

Figure 9:
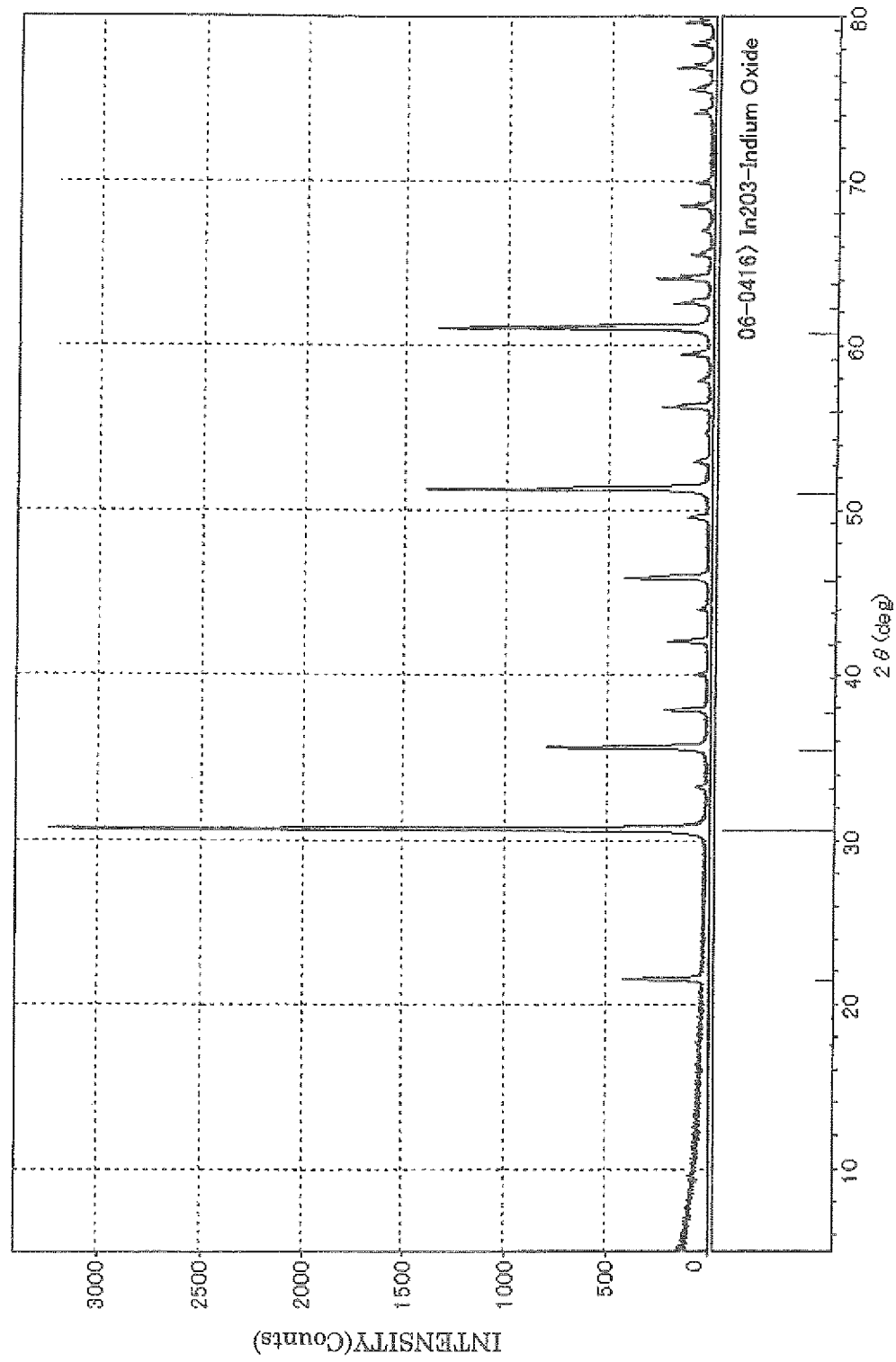
FIG. 9 shows an X-ray diffraction chart of an oxide sintered body produced in Example 9.
Figure 10:
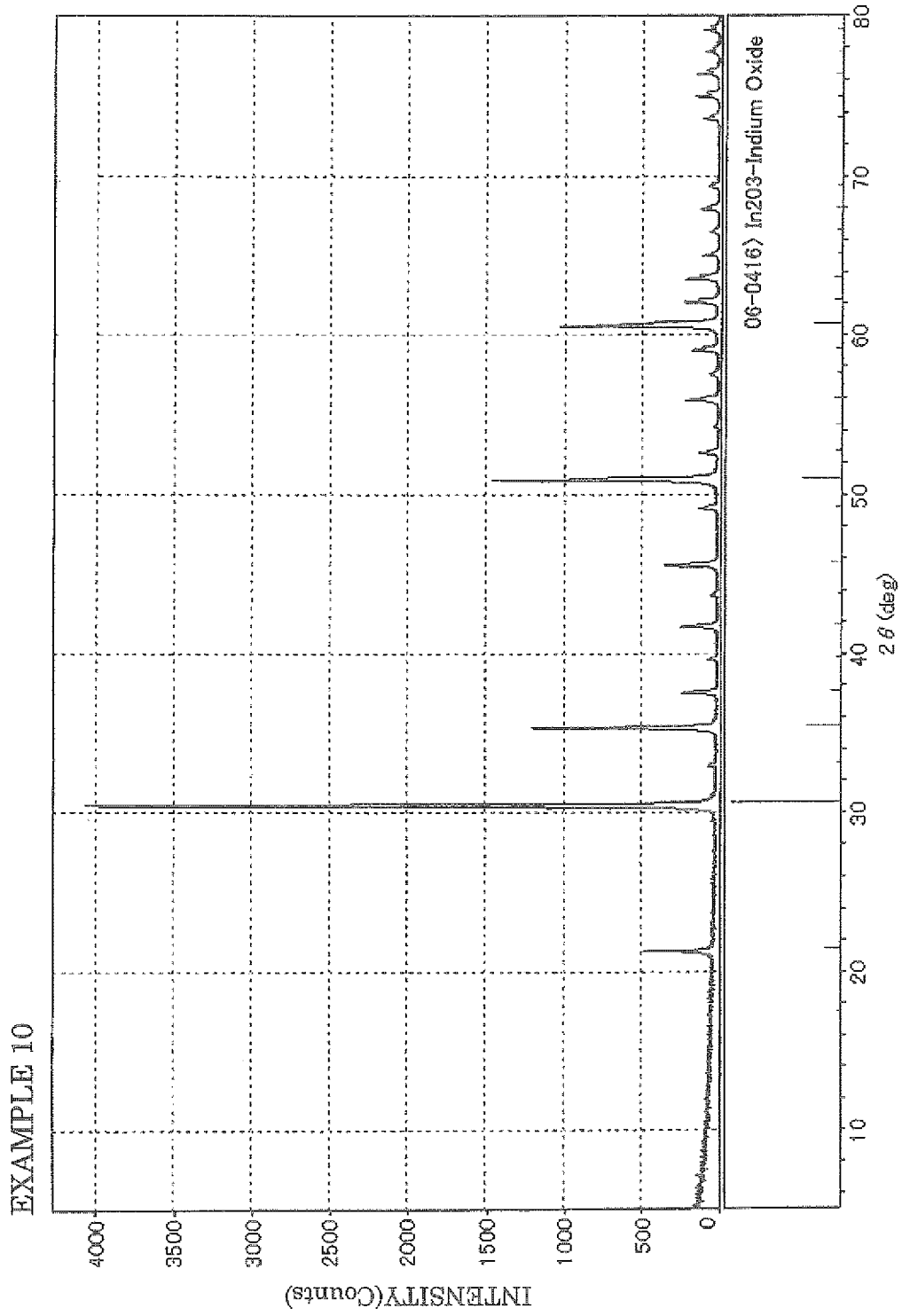
FIG. 10 shows an X-ray diffraction chart of an oxide sintered body produced in Example 10.
Figure 11:
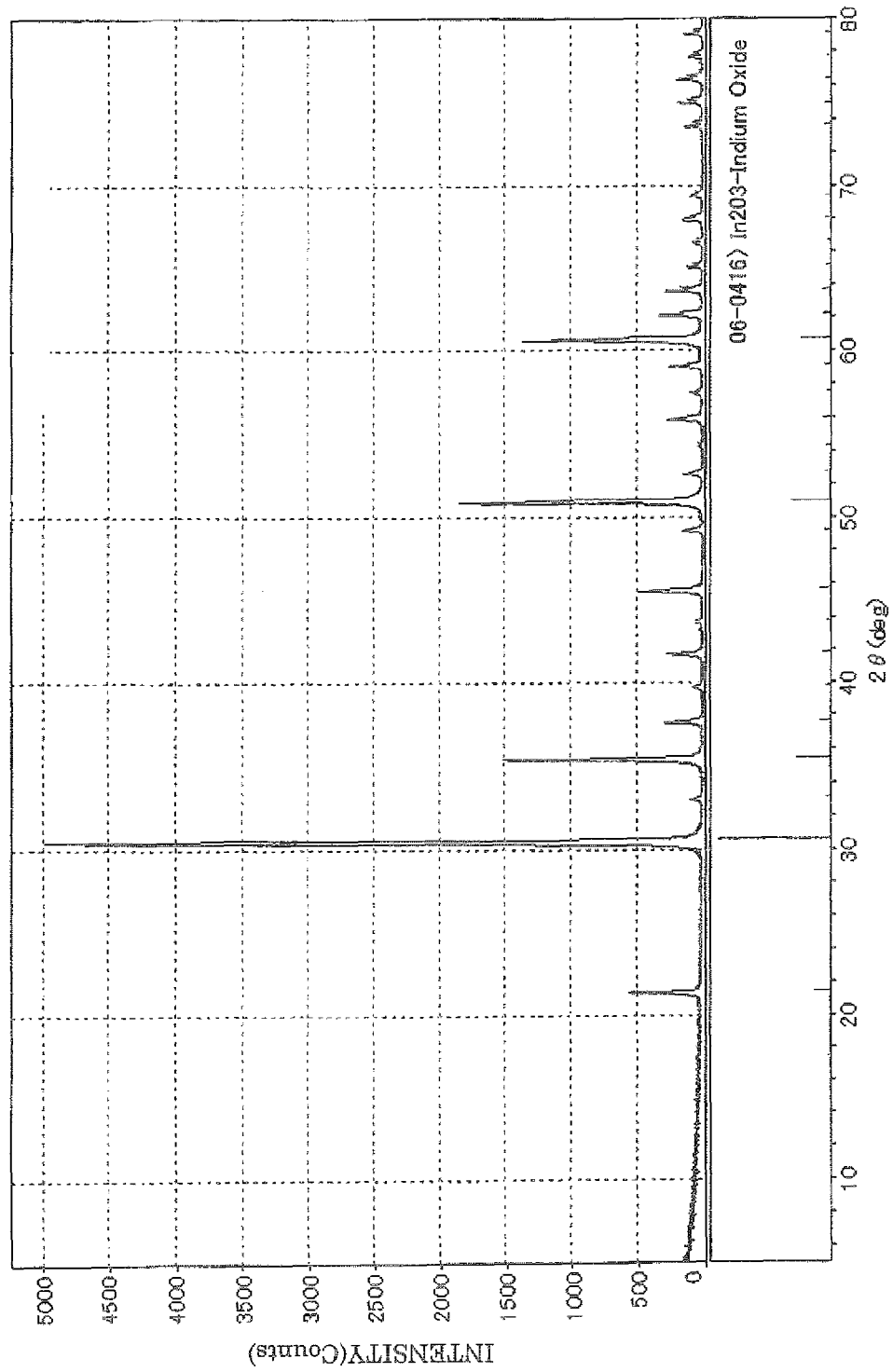
FIG. 11 shows an X-ray diffraction chart of an oxide sintered body produced in Example 11.
Figure 12:
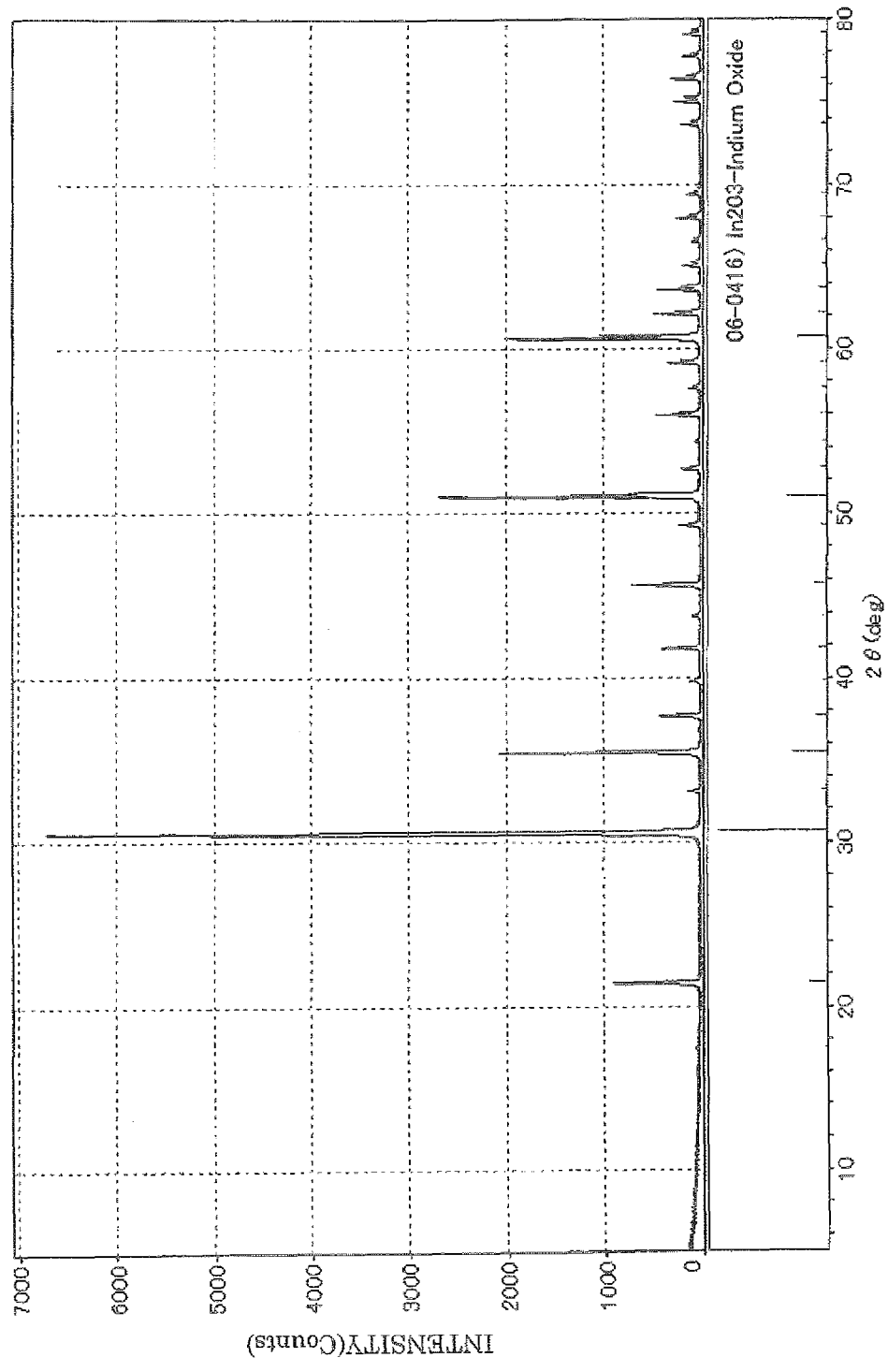
FIG. 12 shows an X-ray diffraction chart of an oxide sintered body produced in Comparative Example 1.
Figure 13:
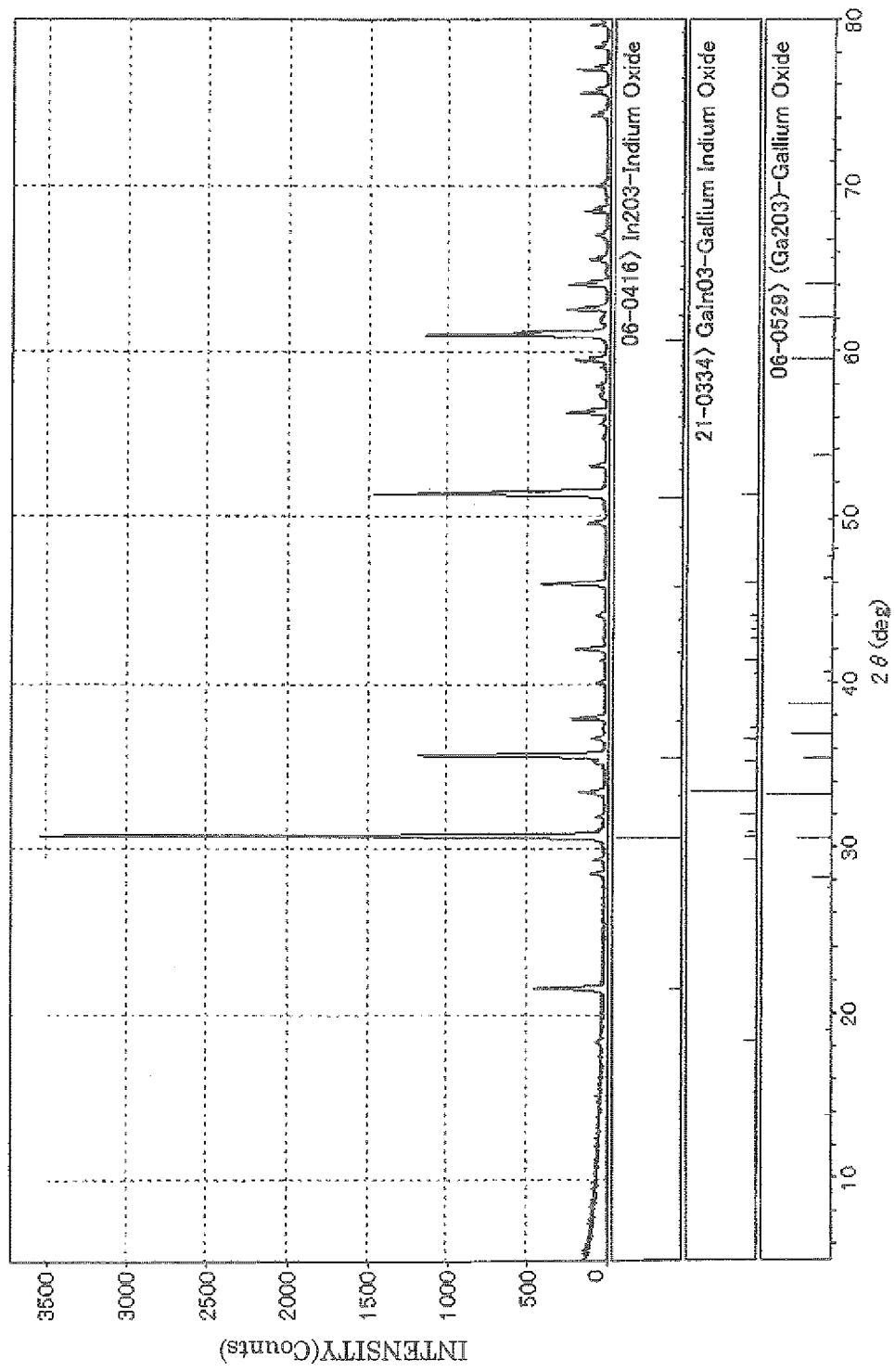
FIG. 13 shows an X-ray diffraction chart of an oxide sintered body produced in Comparative Example 2.
Figure 14:
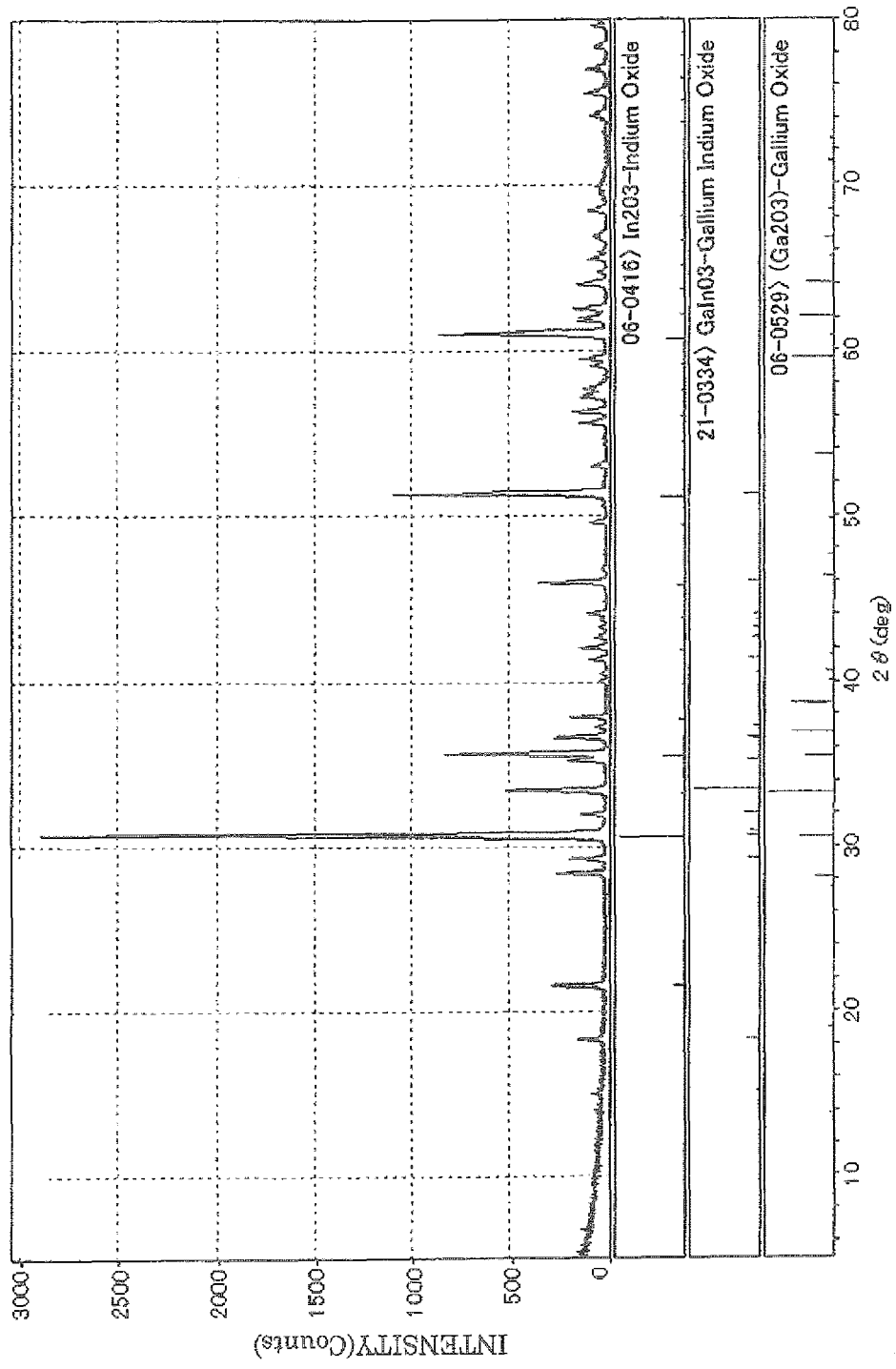
FIG. 14 shows an X-ray diffraction chart of an oxide sintered body produced in Comparative Example 3.
Figure 15:
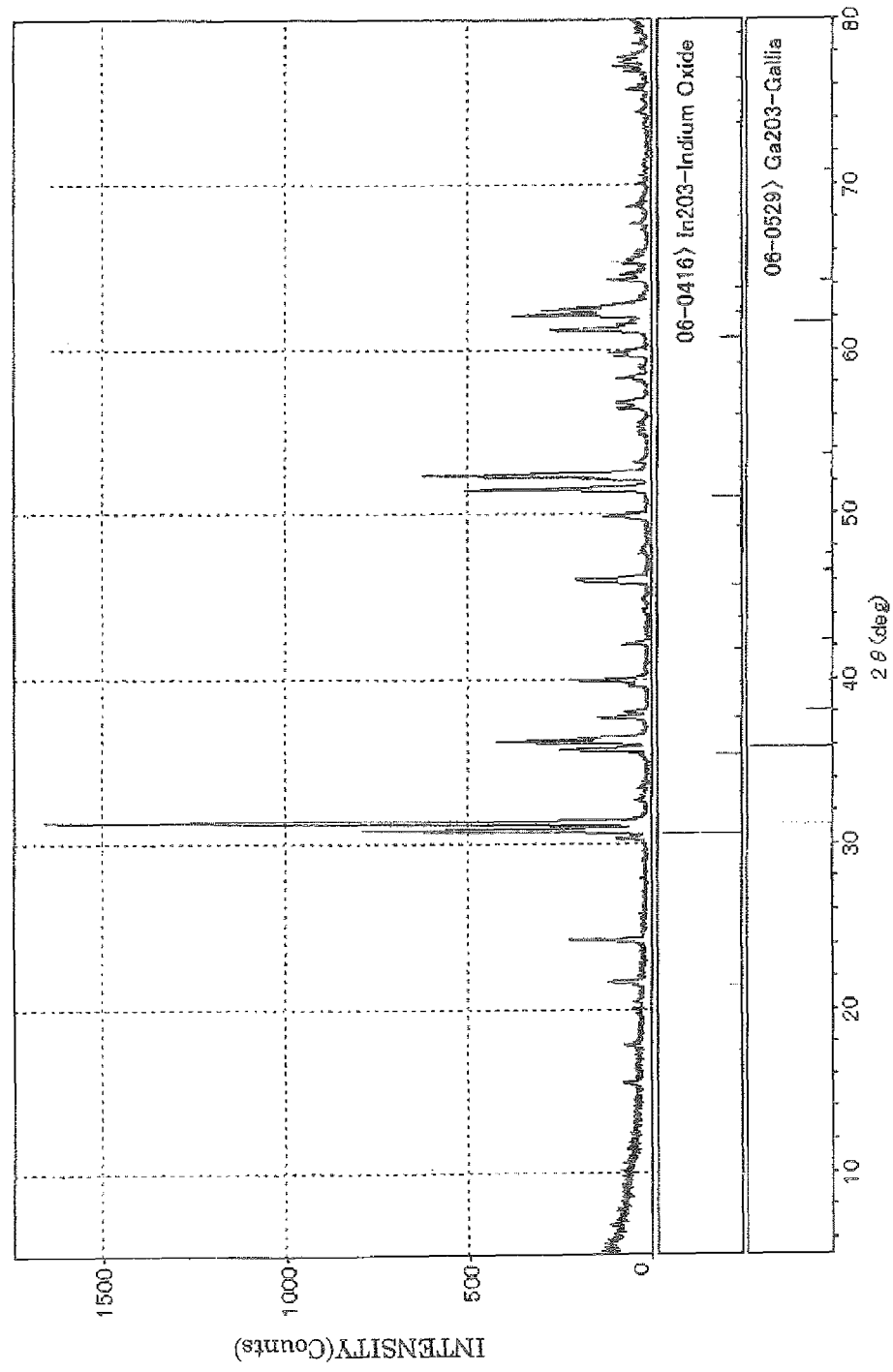
FIG. 15 shows an X-ray diffraction chart of an oxide sintered body produced in Comparative Example 4.

The sintered body was subjected to X-ray diffraction analysis in the same manner as in Example 1. FIGS. 9 to 11 respectively show X-ray diffraction charts of Examples 9 to 11.

As a result of analyzing the X-ray diffraction charts, an $In_2O_3$ bixbyite structure was observed in the sintered bodies of Examples 9 to 11.

Table 2 shows the lattice constants of the sintered bodies of Examples 9 to 11 determined by X-ray diffraction analysis (lattice constant of cubic crystal of $In_2O_3$: 10.118 Å).

Comparative Examples 1 to 4

Production of Oxide Sintered Body

A sintered body was produced and evaluated in the same manner as in Example 1, except for mixing the raw material powders in a Ga/(In+Ga) ratio shown in Table 3, and sintering the shaped product at a temperature shown in Table 3. The results are shown in Table 3.

FIGS. 12 to 15 respectively show X-ray diffraction charts of Comparative Examples 1 to 4. As a result of analyzing the X-ray diffraction charts, an $In_2O_3$ phase and an $InGaO_3$ or $Ga_2O_3$ phase were observed in the sintered bodies of Comparative Examples 1 to 4.

Comparative Example 5

Production of Oxide Sintered Body

A sintered body was produced and evaluated in the same manner as in Example 1, except for mixing the raw material powders in a Ga/(In+Ga) ratio shown in Table 1, and sintering the shaped product at a temperature shown in Table 1. The results are shown in Table 1.

Figure 16:
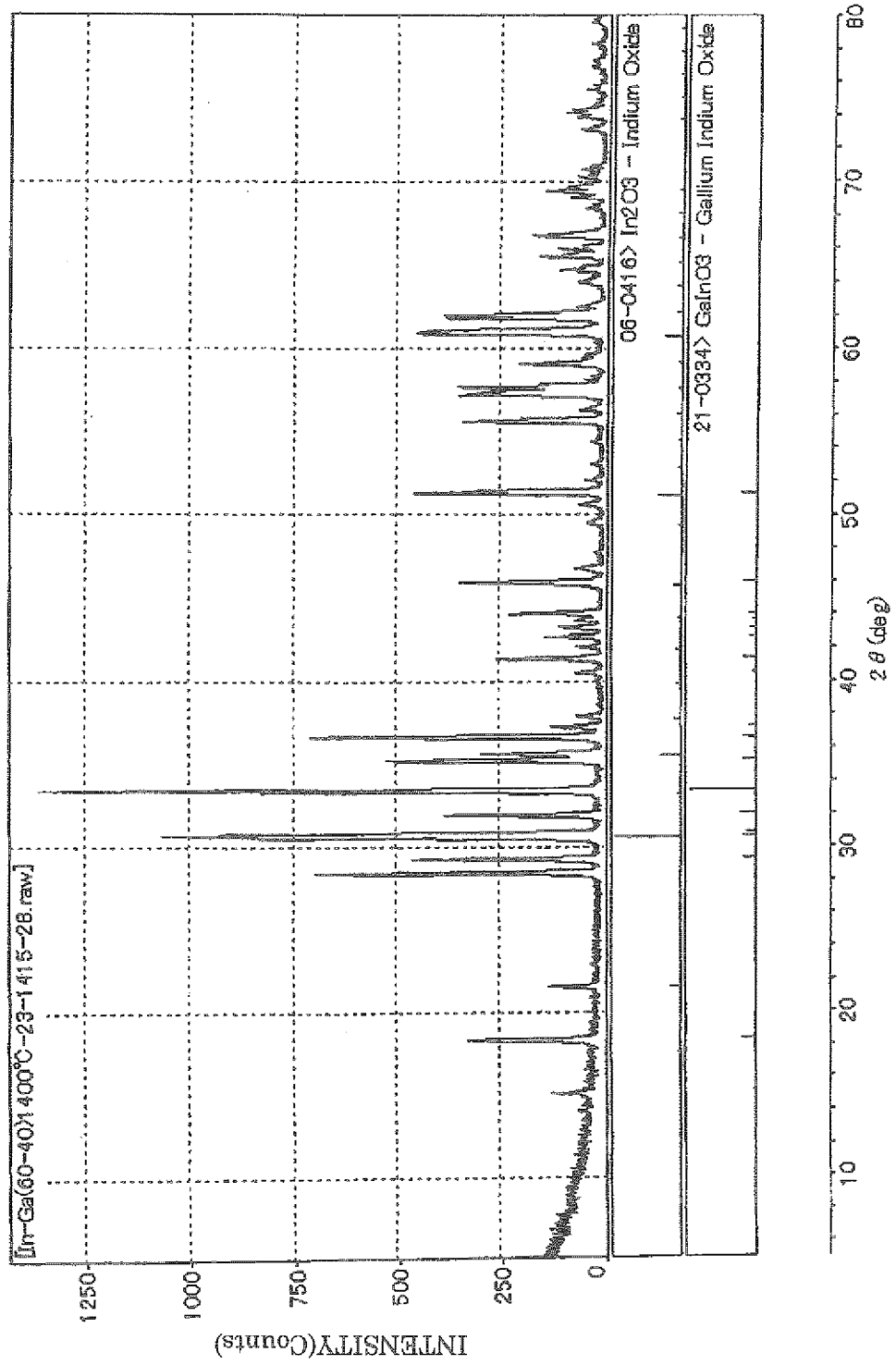
FIG. 16 shows an X-ray diffraction chart of an oxide sintered body produced in Comparative Example 5.

FIG. 16 shows an X-ray diffraction chart of Comparative Example 5. The main peak intensity ratio of an $InGaO_3$ phase to an $In_2O_3$ phase in the X-ray diffraction chart was 1.2.

TABLE 1

| | | | | Impurity concentration (ppm) | | | | |
| --- | --- | --- | --- | --- | --- | --- | --- | --- |
| Example | Ga/(Ga + In) | Sintering temperature °C. | Lattice constant Å | Ions having positive valence of 4 or more | Ions having positive valence of 2 or less | Density of target g/cm³ | Conductivity of target mΩcm | Abnormal discharge during sputtering |
| 1 | 0.02 | 1350 | 10.09188 | 24 | 30 | 6.65 | 4.5 | Did not occur |
| 2 | 0.02 | 1400 | 10.09976 | 26 | 32 | 6.67 | 2.8 | Did not occur |
| 3 | 0.04 | 1400 | 10.06859 | 22 | 28 | 6.68 | 3.4 | Did not occur |
| 4 | 0.029 | 1200 | 10.09602 | 24 | 28 | 6.55 | 4.9 | Did not occur |

TABLE 1-continued

| | | | | Impurity concentration (ppm) | | | | |
|---|---|---|---|---|---|---|---|---|
| Example | Ga/(Ga + In) | Sintering temperature °C. | Lattice constant Å | Ions having positive valence of 4 or more | Ions having positive valence of 2 or less | Density of target g/cm³ | Conductivity of target mΩcm | Abnormal discharge during sputtering |
| 5 | 0.029 | 1400 | 10.09672 | 26 | 25 | 6.82 | 3.8 | Did not occur |
| 6 | 0.029 | 1600 | 10.09458 | 24 | 28 | 6.72 | 3.2 | Did not occur |
| 7 | 0.072 | 1400 | 10.06435 | 22 | 28 | 6.65 | 4.1 | Did not occur |
| 8 | 0.072 | 1600 | 10.0694 | 24 | 30 | 6.96 | 2.4 | Did not occur |

TABLE 2

| | | Additive | | Impurity concentration (ppm) | | | | |
|---|---|---|---|---|---|---|---|---|
| Example | Ga/(Ga + In) | element X/(Ga + In + X) | Sintering temperature °C. | Lattice constant Å | Ions having positive valence of 4 or more | Ions having positive valence of 2 or less | Density of target g/cm³ | Conductivity of target mΩcm | Abnormal discharge during sputtering |
| 9 | 0.072 | X = Sc 0.019 | 1450 | 10.05432 | 24 | 30 | 6.65 | 4.5 | Did not occur |
| 10 | 0.072 | X = Y 0.012 | 1400 | 10.09976 | 26 | 32 | 6.67 | 2.8 | Did not occur |
| 11 | 0.072 | X = Al 0.026 | 1400 | 10.06859 | 22 | 28 | 6.68 | 3.4 | Did not occur |

TABLE 3

| | | | | Impurity concentration (ppm) | | | | |
|---|---|---|---|---|---|---|---|---|
| Comparative Example | Ga/(Ga + In) | Sintering temperature °C. | Lattice constant Å | Ions having positive valence of 4 or more | Ions having positive valence of 2 or less | Density of target g/cm³ | Conductivity of target mΩcm | Abnormal discharge during sputtering |
| 1 | 0.0 | 1400 | 10.1184 | 42 | 34 | 6.45 | 15.2 | Occurred: Surface blackened |
| 2 | 0.14 | 1400 | InGaO₃ phase was observed | 38 | 24 | 6.81 | 18.1 | Micro-arc occurred |
| 3 | 0.27 | 1400 | InGaO₃ phase was observed | 36 | 28 | 6.38 | 25.3 | Micro-arc occurred |
| 4 | 0.27 | 1600 | InGaO₃ phase was observed | 38 | 24 | 6.91 | 14.8 | Micro-arc occurred |
| 5 | 0.4 | 1400 | InGaO₃ phase was observed | 25 | 20 | 5.94 | 3800 | Occurred: Surface blackened |

Figure 17:
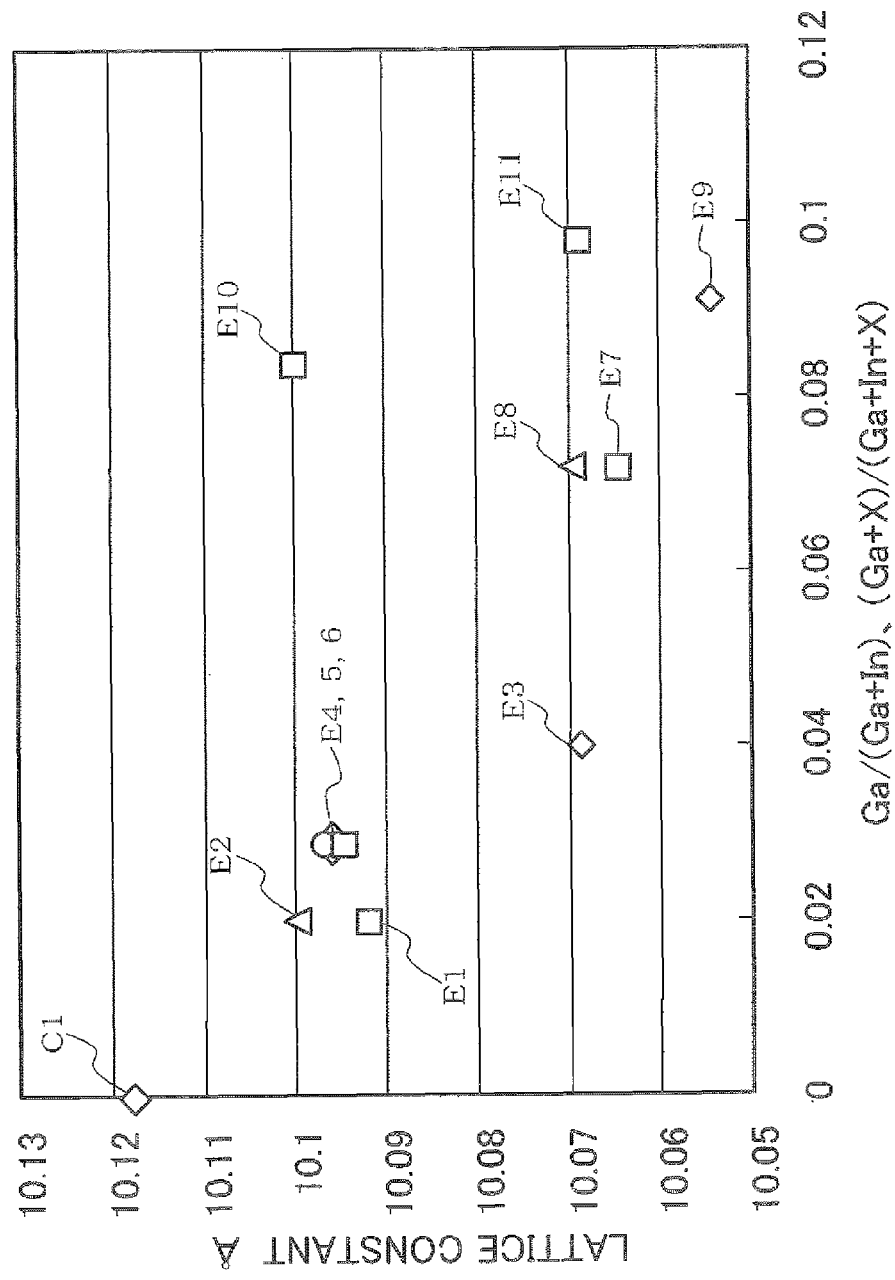
FIG. 17 shows the relationship between the amount of Ga or (Ga+X) added and the lattice constant of Examples 1 to 11 and Comparative Example 1.

FIG. 17 shows the amount of Ga or (Ga+X) added and the lattice constant distribution of Examples 1 to 11 and Comparative Example 1. In FIG. 17, the symbol "E" indicates "Example", and the symbol "C" indicates "Comparative Example". As shown in FIG. 17, the sintered bodies of Examples 1 to 11 had a small lattice constant.

Example 12

Production of Thin Film Transistor

A semiconductor film (thickness: 50 nm) was formed by sputtering on a conductive silicon substrate (provided with a thermally oxidized film (SiO₂ film) (thickness: 100 nm)) and a quartz glass substrate using the indium oxide (97 atom % (metal content))–gallium oxide (3 atom % (metal content)) target (Ga/(In+Ga)=0.03) obtained in Example 4. Specifically, the atmosphere was evacuated until the back pressure became $5 \times 10^{-4}$ Pa, and the sputtering process was performed at room temperature at a pressure of 0.2 Pa and a sputtering power of 100 W while introducing argon (8.5 sccm) and oxygen (1.5 sccm).

A channel region (length: 200 μm, width: 1000 μm) was formed on the conductive silicon substrate (on which the thin film was formed) via a metal mask, and source/drain electrodes were formed by depositing gold.

The conductive silicon substrate was heated in a heating furnace at 350° C. for 30 minutes in air.

An SiO₂ film was then formed on the conductive silicon substrate (thin film) by plasma CVD.

A normally-off thin film transistor having a field-effect mobility of 91.4 cm²/V·sec and an on-off ratio of $4.5 \times 10^7$ was thus obtained. The thin film transistor had clear pinch-off output characteristics. The S value was 0.45. A sift in threshold voltage (Vth) after applying a voltage of 20 V to the gate for 100 minutes was 0.2 V or less.

The quartz glass substrate on which the thin film was formed was heated in a hot-blast heating furnace at 350° C. for 30 minutes in air. As a result of XRD analysis of the thin film, a peak indicating a single-phase indium oxide bixbyite structure was observed. The quartz glass substrate was heated at 450° C. for 5 hours in air, and the thin film was subjected to XRD analysis. The peak intensity obtained after heating the quartz glass substrate at 350° C. was almost equal to that obtained after heating the quartz glass substrate at 450° C. (i.e., a single-phase bixbyite structure was observed). The lattice constant of the crystalline indium oxide thin film was 10.10285 Å.

The carrier concentration of the thin film determined by Hall effect measurement was $1.4 \times 10^{18}/cm^{-3}$.

Example 13

Production of Thin Film Transistor

A thin film transistor was produced, and the characteristics thereof were evaluated in the same manner as in Example 12, except for using the indium oxide (92.8 atom % (metal content))–gallium oxide (7.2 atom % (metal content)) target (Ga/(In+Ga)=0.072) obtained in Example 7.

A normally-off thin film transistor having a field-effect mobility of 123.7 cm$^2$/V·sec and an on-off ratio of $4.7 \times 10^8$ was thus obtained. The thin film transistor had clear pinch-off output characteristics. The S value was 0.5. A sift in threshold voltage (Vth) after applying a voltage of 20 V to the gate for 100 minutes was 0.2 V or less.

A thin film formed on a quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.04692 Å.

The carrier concentration of the thin film determined by Hall effect measurement was $1.2 \times 10^{18}/cm^{-3}$.

Example 14

Production of Thin Film Transistor

A thin film transistor was produced, and the characteristics thereof were evaluated in the same manner as in Example 12, except for using an indium oxide (88.6 atom % (metal content))–gallium oxide (11.4 atom % (metal content)) target (Ga/(In+Ga)=0.114) obtained in the same manner as in Example 1 (i.e., the composition was changed).

A normally-off thin film transistor having a field-effect mobility of 64.5 cm$^2$/V·sec and an on-off ratio of $4.2 \times 10^9$ was thus obtained. The thin film transistor had clear pinch-off output characteristics. The S value was 0.45. A sift in threshold voltage (Vth) after applying a voltage of 20 V to the gate for 100 minutes was 0.2 V or less.

A thin film formed on a quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.01289 Å, and the carrier concentration was $1.5 \times 10^{18}/cm^{-3}$.

Example 15

Production of Thin Film Transistor

A semiconductor film was formed on a conductive silicon substrate (provided with a thermally oxidized film (SiO$_2$ film) (thickness: 100 nm)) and a quartz substrate at room temperature in the same manner as in Example 12, except for using the indium oxide (98 atom % (metal content))–gallium oxide (2 atom % (metal content)) target ((Ga/(In+Ga)=0.02) obtained in Example 1.

The conductive silicon substrate was heated in a hot-blast heating furnace at 300° C. for 30 minutes in air.

Molybdenum metal was then deposited on the conductive silicon substrate to a thickness of 300 nm.

A resist was then applied to the conductive silicon substrate, pre-baked at 80° C. for 15 minutes, exposed to UV light (intensity: 300 mJ/cm$^2$) via a mask, developed using 3 wt % tetramethylammonium hydroxide, washed with purified water, and post-baked at 130° C. for 15 minutes to form a resist pattern having the desired source/drain electrode shape.

Figure 18:
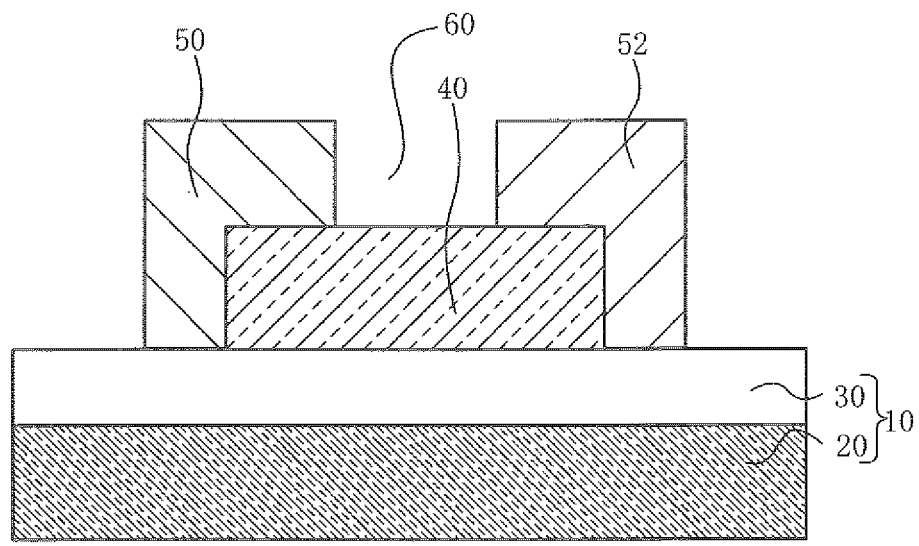
FIG. 18 is a view showing the structure of a channel-etch thin film transistor produced in Example 15.

The molybdenum metal deposited on the substrate provided with the resist pattern was etched using a mixed acid of phosphoric acid, acetic acid, and nitric acid, washed with purified water, and dried by blowing air. The characteristics of the resulting channel-etch thin film transistor were evaluated. FIG. 18 shows the structure of the channel-etch thin film transistor obtained in Example 15. In FIG. 18, reference numeral 10 indicates a conductive silicon substrate, reference numeral 20 indicates a conductive silicon member, and reference numeral 30 indicates a thermally oxidized film (SiO$_2$ film). The conductive silicon member 20 functions as a gate electrode, and the thermally oxidized film 30 functions as a gate insulating film. Reference numeral 40 indicates a semiconductor film formed using the target, reference numerals 50 and 52 indicate a source electrode and a drain electrode formed of molybdenum metal, and reference numeral 60 indicates a channel region.

A normally-off thin film transistor having a field-effect mobility of 60.2 cm$^2$/V·sec and an on-off ratio of $4.5 \times 10^6$ was thus obtained. The thin film transistor had clear pinch-off output characteristics. The S value was 0.9. A sift in threshold voltage (Vth) after applying a voltage of 20 V to the gate for 100 minutes was 0.2 V or less.

The thin film formed on the quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.10628 Å, and the carrier concentration was $1.5 \times 10^{18}/cm^{-3}$.

Example 16

Production of Thin Film Transistor

A semiconductor film was formed on a conductive silicon substrate (provided with a thermally oxidized film (SiO$_2$ film) (thickness: 100 nm)) and a quartz substrate at room temperature in the same manner as in Example 12, except for using the indium oxide (93 atom % (metal content))–gallium oxide (5 atom % (metal content))–scandium oxide (2 atom % (metal content)) target (Ga/(In+Ga)=0.051, Sc/(In+Ga+Sc)=0.02) obtained in the same manner as in Example 9.

An etch stopper (aluminum oxide) was then formed on the conductive silicon substrate (on which the oxide thin film was formed) via a metal mask. After removing the metal mask, molybdenum metal was deposited over the entire surface of the conductive silicon substrate to a thickness of 300 nm.

A resist was then applied to the conductive silicon substrate, pre-baked at 80° C. for 15 minutes, exposed to UV light (intensity: 300 mJ/cm$^2$) via a mask, developed using 3 wt % tetramethylammonium hydroxide, washed with purified water, and post-baked at 130° C. for 15 minutes to form a resist pattern having the desired source/drain electrode shape.

Figure 19:
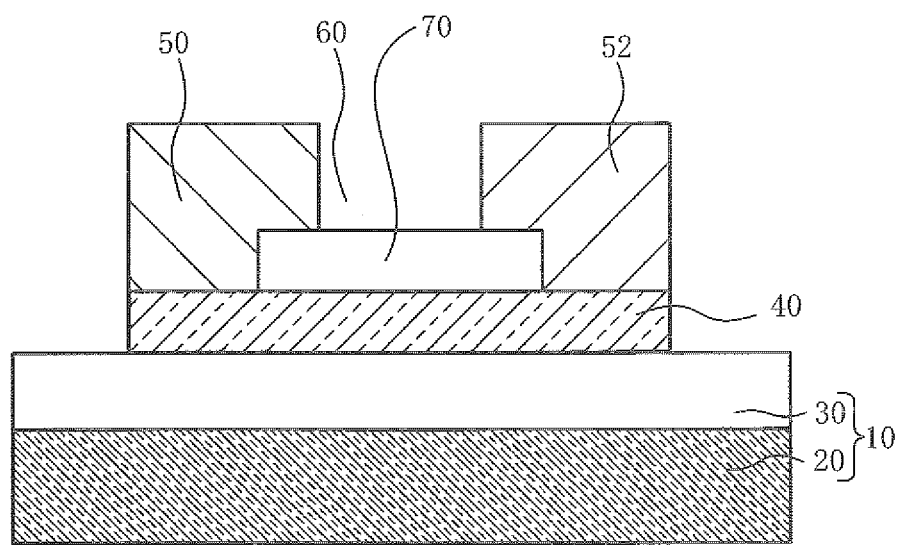
FIG. 19 is a view showing the structure of an etch-stopper thin film transistor produced in Examples 16 and 19.

The molybdenum metal and the oxide thin film on the substrate provided with the resist pattern were etched using a mixed acid of phosphoric acid, acetic acid, and nitric acid, washed with purified water, and dried by blowing air. The substrate was then heated in a hot-blast heating furnace at 350° C. for 30 minutes in air. The characteristics of the resulting etch-stopper thin film transistor were evaluated. FIG. 19 shows the structure of the etch-stopper thin film transistor obtained in Example 16. In FIG. 19, reference numeral 10 indicates a conductive silicon substrate, reference numeral 20 indicates a conductive silicon member, and reference numeral 30 indicates a thermally oxidized film ($SiO_2$ film). The conductive silicon member 20 functions as a gate electrode, and the thermal oxide film 30 functions as a gate insulating film. Reference numeral 40 indicates a semiconductor film formed using the target, and reference numerals 50 and 52 indicate a source electrode and a drain electrode formed of molybdenum metal. Reference numeral 60 indicates a channel region, and reference numeral 70 indicates an etch stopper.

A normally-off thin film transistor having a field-effect mobility of 42.5 $cm^2/V \cdot sec$ and an on-off ratio of $9.5 \times 10^7$ was thus obtained. The thin film transistor had clear pinch-off output characteristics. The S value was 0.8. A sift in threshold voltage (Vth) after applying a voltage of 20 V to the gate for 100 minutes was 0.2 V or less.

The thin film formed on the quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.0624 Å, and the carrier concentration was $2.1 \times 10^{18}/cm^{-3}$.

Example 17

Production of Thin Film Transistor

A thin film transistor was produced, and the characteristics thereof were evaluated in the same manner as in Example 12, except for using an indium oxide (90.9 atom % (metal content))–gallium oxide (7.2 atom % (metal content))–aluminum oxide (1.9 atom % (metal content)) target (Ga/(In+Ga)=0.073, Al/(In+Ga+Al)=0.019)) obtained in the same manner as in Example 11.

A normally-off thin film transistor having a field-effect mobility of 46.5 $cm^2/V \cdot sec$ and an on-off ratio of $4.4 \times 10^7$ was thus obtained. The thin film transistor had clear pinch-off output characteristics. The S value was 0.7. A sift in threshold voltage (Vth) after applying a voltage of 20 V to the gate for 100 minutes was 0.2 V or less.

The thin film formed on the quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.04992 Å, and the carrier concentration was $2.0 \times 10^{18}/cm^{-3}$.

Example 18

Production of Thin Film Transistor

A thin film transistor was produced, and the characteristics thereof were evaluated in the same manner as in Example 12, except for using an indium oxide (95.1 atom % (metal content))–gallium oxide (4 atom % (metal content))–boron oxide (0.9 atom % (metal content)) target (Ga/(In+Ga)=0.040, B/(In+Ga+B)=0.009)) obtained in the same manner as in Example 9.

A normally-off thin film transistor having a field-effect mobility of 49.7 $cm^2/V \cdot sec$ and an on-off ratio of $9.96 \times 10^7$ was thus obtained. The thin film transistor had clear pinch-off output characteristics. The S value was 0.45. A sift in threshold voltage (Vth) after applying a voltage of 20 V to the gate for 100 minutes was 0.2 V or less.

The thin film formed on the quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.08936 Å, and the carrier concentration was $2.4 \times 10^{18}/cm^{-3}$.

Example 19

Production of Thin Film Transistor

A semiconductor film was formed on a conductive silicon substrate (provided with a thermally oxidized film ($SiO_2$ film) (thickness: 100 nm)) and a quartz substrate at room temperature in the same manner as in Example 16, except for using an indium oxide (97 atom % (metal content))–gallium oxide (2 atom % (metal content))–scandium oxide (1 atom % (metal content)) target (Ga/(In+Ga)=0.021, Sc/(In+Ga+Sc)=0.01) obtained in the same manner as in Example 9, and an etch-stopper thin film transistor shown in FIG. 19 was produced, and evaluated.

A normally-off thin film transistor having a field-effect mobility of 62.5 $cm^2/V \cdot sec$ and an on-off ratio of $3.5 \times 10^6$ was thus obtained. The thin film transistor had clear pinch-off output characteristics. The S value was 0.7. A sift in threshold voltage (Vth) after applying a voltage of 20 V to the gate for 100 minutes was 0.2 V or less.

The thin film formed on the quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.0728 Å, and the carrier concentration was $1.1 \times 10^{18}/cm^{-3}$.

Comparative Example 6

Production of Thin Film Transistor

A thin film transistor was formed on a conductive silicon substrate (provided with a thermally oxidized film ($SiO_2$ film) (thickness: 100 nm)), and the characteristics thereof were evaluated in the same manner as in Example 12, except for using an indium oxide (100 atom % (metal content)) target.

A normally-on thin film transistor having a field-effect mobility of 25.2 cm$^2$/V·sec and an on-off ratio of 10$^7$ was thus obtained. The thin film transistor had clear pinch-off output characteristics. The S value was 1.4.

A thin film formed on a quartz glass substrate was heated, and evaluated in the same manner as in Example 12. As a result of XRD analysis of the thin film, a peak indicating an indium oxide bixbyite structure was observed. The peak intensity obtained after heating the quartz glass substrate at 350° C. was almost equal to that obtained after heating the quartz glass substrate at 450° C. (i.e., a single-phase bixbyite structure was observed). The lattice constant of the thin film was 10.1250 Å, and the carrier concentration was 6.5×10$^{18}$/cm$^{-3}$.

Comparative Example 7

Production of Thin Film Transistor

A thin film transistor was formed on a conductive silicon substrate (provided with a thermally oxidized film (SiO$_2$ film) (thickness: 100 nm)), and the characteristics thereof were evaluated in the same manner as in Example 12, except for using an indium oxide (70 atom % (metal content))–gallium oxide (30 atom % (metal content)) target (Ga/(In+Ga)=0.3).

A normally-on thin film transistor having a field-effect mobility of 15.7 cm$^2$/V·sec and an on-off ratio of 10$^6$ was thus obtained. The thin film transistor had clear pinch-off output characteristics. The S value was 1.4.

A thin film formed on a quartz glass substrate was heated, and evaluated in the same manner as in Example 12. As a result of XRD analysis of the thin film, a peak indicating an indium oxide bixbyite structure was not observed. It was determined that the thin film formed of indium oxide and gallium oxide was amorphous based on the above results. The carrier concentration of the thin film was 10.2×10$^{18}$/cm$^{-3}$.

The amorphous thin film formed of indium oxide and gallium oxide was immersed in a mixed acid of phosphoric acid, acetic acid, and nitric acid (25° C.) for 10 minutes to evaluate acid resistance. As a result, the amorphous thin film was dissolved in the mixed acid. This indicates that the amorphous thin film did not have acid resistance.

Comparative Example 8

Production of Thin Film Transistor

A thin film transistor was formed on a conductive silicon substrate (provided with a thermally oxidized film (SiO$_2$ film) (thickness: 100 nm)), and the characteristics thereof were evaluated in the same manner as in Example 12, except for using an indium oxide (86 atom % (metal content))–gallium oxide (14 atom % (metal content)) target (Ga/(In+Ga)=0.14).

A normally-on thin film transistor having a field-effect mobility of 22.3 cm$^2$/V·sec and an on-off ratio of 10$^6$ was thus obtained. The thin film transistor had clear pinch-off output characteristics. The S value was 1.3.

A thin film formed on a quartz glass substrate was heated, and evaluated in the same manner as in Example 12. As a result of XRD analysis of the thin film, a clear peak indicating an indium oxide bixbyite structure was not observed. It was determined that most of the thin film formed of indium oxide and gallium oxide was amorphous based on the above results. The carrier concentration of the thin film was 10.2×10$^{18}$/cm$^{-3}$.

The amorphous thin film formed of indium oxide and gallium oxide was immersed in a mixed acid of phosphoric acid, acetic acid, and nitric acid (25° C.) for 10 minutes to evaluate acid resistance. As a result, the amorphous thin film was dissolved in the mixed acid. This indicates that the amorphous thin film did not have acid resistance.

A micro-arc was observed during a sputtering discharge.

Figure 20:
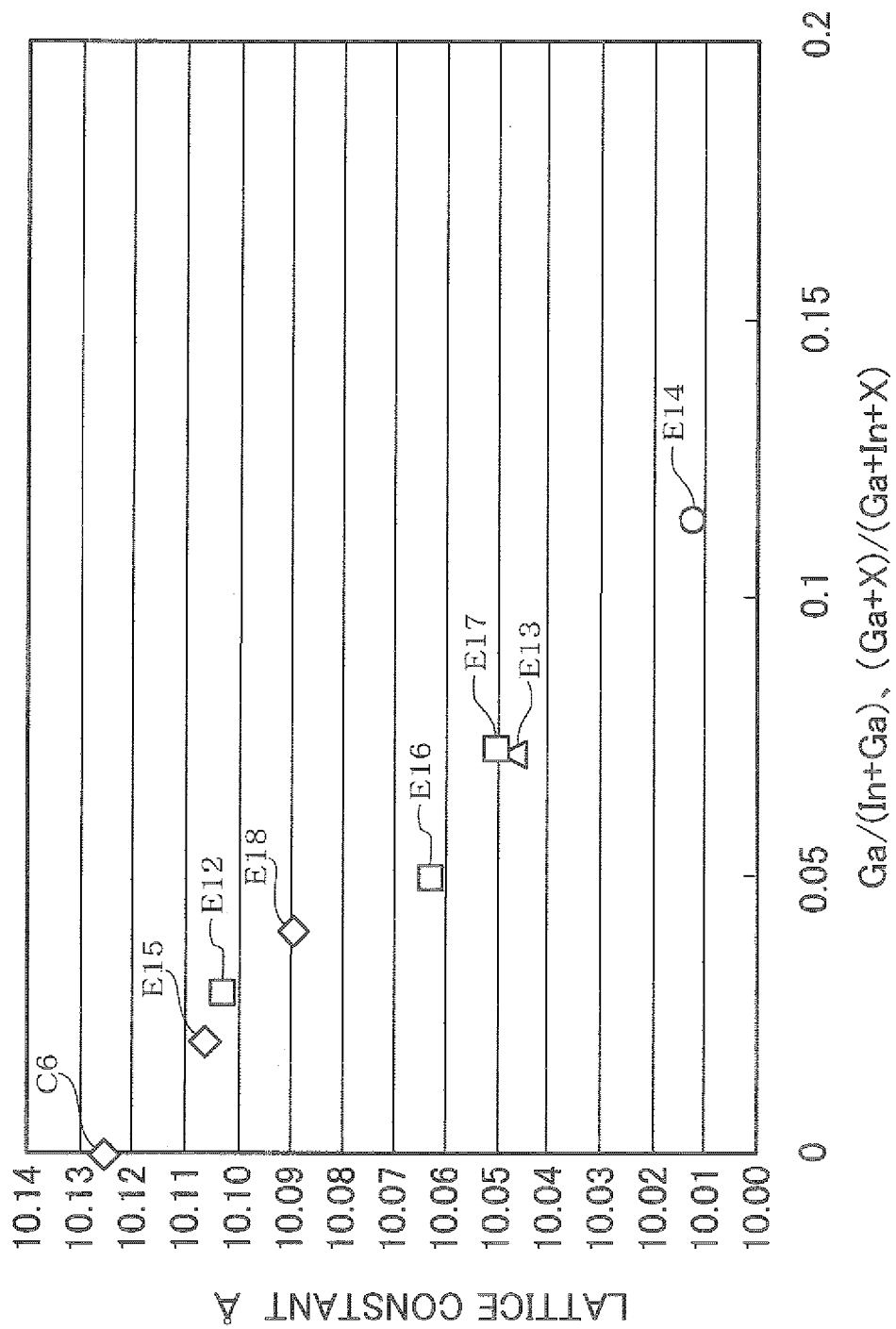
FIG. 20 shows the relationship between the amount of Ga or (Ga+X) added and the lattice constant of Examples 12 to 18 and Comparative Example 6.

FIG. 20 shows the amount of Ga or (Ga+X) added and the lattice constant distribution of Examples 12 to 18 and Comparative Example 6. In FIG. 20, the symbol "E" indicates "Example", and the symbol "C" indicates "Comparative Example". As shown in FIG. 20, the thin films of Examples 12 to 18 had a small lattice constant.

INDUSTRIAL APPLICABILITY

The oxide sintered body according to the invention may be used as a sputtering target. A thin film formed using the sputtering target according to the invention may be used for a thin film transistor.

The contents of the documents referred to herein are incorporated herein by reference.

The invention claimed is:

1. An oxide sintered body comprising indium oxide and gallium solid-solved therein, the oxide sintered body having an atomic ratio Ga/(Ga+In) of 0.05 to 0.08, containing indium and gallium in an amount of 97.4 atom % or more based on total metal atoms, having a density of 6.65 to 7.1 g/cm$^3$ and having an In$_2$O$_3$ bixbyite structure wherein the oxide sintered body comprises gallium, indium and oxygen as its essential components and may comprise scandium, yttrium, aluminum, or impurities, provided that the oxide sintered body does not comprise any other components other than gallium, indium, scandium, yttrium, aluminum, oxygen and impurities.

2. The oxide sintered body according to claim 1, wherein the bixbyite structure has a lattice constant of 10.05 Å or more and less than 10.118 Å.

3. The oxide sintered body according to claim 1, the oxide sintered body having a bulk resistivity of 10 mΩcm or less.

4. The oxide sintered body according to claim 1, wherein the oxide sintered body comprises dispersed gallium aggregates having a diameter of less than 1 μm.

5. The oxide sintered body according to claim 1, the oxide sintered body having a content of metal ions having a positive valence of 4 or more of 100 atomic ppm or less.

6. The oxide sintered body according to claim 1, the oxide sintered body having a content of metal ions having a positive valence of 2 or less of 100 atomic ppm or less, the content of metal ions having a positive valence of 4 being equal to or lower than the content of metal ions having a positive valence of 2.

7. The oxide sintered body according to claim 1, further comprising one or two or more oxides selected from yttrium oxide, scandium oxide, aluminum oxide, and boron oxide.

8. The oxide sintered body according to claim 7, the oxide sintered body having a content of the one or two or more oxides selected from yttrium oxide, scandium oxide, aluminum oxide, and boron oxide, of 0.01 to 5 atom %.

9. A method of producing the oxide sintered body according to claim 1, the method comprising mixing an indium compound powder having an average particle size of less than 2 μm with a gallium compound powder having an average particle size of less than 2 μm in an atomic ratio Ga/(Ga+In) of 0.05 to 0.08, shaping the resulting mixture, and firing the resulting shaped product at 1200 to 1600° C. for 2 to 96 hours.

10. The method according to claim 9, wherein the shaped product is fired in an oxygen atmosphere or under pressure.

11. A sputtering target comprising the oxide sintered body according to claim 1.

* * * * *